(12) United States Patent
Chou et al.

(10) Patent No.: US 8,951,876 B2
(45) Date of Patent: Feb. 10, 2015

(54) SEMICONDUCTOR DEVICE AND MANUFACTURING METHOD THEREOF

(75) Inventors: Ling-Chun Chou, Yun-Lin County (TW); I-Chang Wang, Tainan (TW); Ching-Wen Hung, Tainan (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 158 days.

(21) Appl. No.: 13/527,608

(22) Filed: Jun. 20, 2012

(65) Prior Publication Data

US 2013/0341685 A1  Dec. 26, 2013

(51) Int. Cl.
  *H01L 21/336* (2006.01)

(52) U.S. Cl.
  USPC ............................ 438/303; 438/184; 438/197

(58) Field of Classification Search
  CPC .......................... H01L 29/6653; H01L 29/6656
  USPC .................. 438/142, 197, 181, 184, 303, 304
  See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,447,884 A | 9/1995 | Fahey |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,245,626 B1 | 6/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |

(Continued)

*Primary Examiner* — Matthew E Warren
(74) *Attorney, Agent, or Firm* — Winston Hsu; Scott Margo

(57) ABSTRACT

A manufacturing method for a semiconductor device includes providing a substrate having at least a gate structure formed thereon and a first spacer formed on sidewalls of the gate structure, performing an ion implantation to implant dopants into the substrate, forming a disposal spacer having at least a carbon-containing layer on the sidewalls of the gate structure, the carbon-containing layer contacting the first spacer, and performing a thermal treatment to form a protecting layer between the carbon-containing layer and the first spacer.

25 Claims, 28 Drawing Sheets

(56) References Cited

U.S. PATENT DOCUMENTS

| | | |
|---|---|---|
| 6,642,122 B1 | 11/2003 | Yu |
| 6,652,718 B1 | 11/2003 | D'Couto |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,115,974 B2 | 10/2006 | Wu et al. |
| 7,118,952 B2 | 10/2006 | Chen |
| 7,118,987 B2 | 10/2006 | Fu |
| 7,119,404 B2 | 10/2006 | Chang |
| 7,132,338 B2 | 11/2006 | Samoilov |
| 7,138,323 B2 | 11/2006 | Kavalieros |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,271,464 B2 | 9/2007 | Trivedi |
| 7,288,822 B1 | 10/2007 | Ting |
| 7,303,999 B1 | 12/2007 | Sriraman |
| 7,314,793 B2 | 1/2008 | Frohberg |
| 7,335,959 B2 | 2/2008 | Curello |
| 7,396,728 B2 | 7/2008 | Varghese |
| 7,410,859 B1 | 8/2008 | Peidous |
| 7,456,067 B2 | 11/2008 | Ang |
| 7,462,239 B2 | 12/2008 | Brabant |
| 7,482,245 B1 | 1/2009 | Yu |
| 7,491,615 B2 | 2/2009 | Wu |
| 7,494,856 B2 | 2/2009 | Zhang |
| 7,494,858 B2 | 2/2009 | Bohr |
| 7,517,816 B2 | 4/2009 | Frohberg |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 7,960,237 B2 * | 6/2011 | Chidambarrao et al. ..... 438/300 |
| 2002/0135071 A1 | 9/2002 | Kang |
| 2002/0160587 A1 | 10/2002 | Jagannathan |
| 2002/0182423 A1 | 12/2002 | Chu |
| 2002/0182795 A1 | 12/2002 | Bae et al. |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0001095 A1 | 1/2006 | Doris |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0197161 A1 | 9/2006 | Takao |
| 2006/0228842 A1 | 10/2006 | Zhang |
| 2006/0231826 A1 | 10/2006 | Kohyama |
| 2006/0258126 A1 | 11/2006 | Shiono |
| 2006/0281245 A1 | 12/2006 | Okuno |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0063294 A1 * | 3/2007 | Bu et al. ..................... 257/408 |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0141852 A1 | 6/2007 | Stapelmann |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0173947 A1 | 7/2008 | Hou |
| 2008/0220579 A1 | 9/2008 | Pal |
| 2008/0233722 A1 | 9/2008 | Liao |
| 2008/0233746 A1 | 9/2008 | Huang |
| 2008/0242020 A1 | 10/2008 | Chen |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0159981 A1 | 6/2009 | Niimi |
| 2009/0166625 A1 | 7/2009 | Ting |
| 2009/0184402 A1 | 7/2009 | Chen |
| 2009/0186475 A1 | 7/2009 | Ting |
| 2009/0230439 A1 | 9/2009 | Wang |
| 2009/0246922 A1 | 10/2009 | Wu |
| 2009/0278170 A1 | 11/2009 | Yang |
| 2009/0289284 A1 | 11/2009 | Goh |
| 2009/0302348 A1 | 12/2009 | Adam |
| 2010/0001317 A1 | 1/2010 | Chen |
| 2010/0093147 A1 | 4/2010 | Liao |
| 2010/0184359 A1 | 7/2010 | Park |

* cited by examiner

SEMICONDUCTOR DEVICE AND MANUFACTURING METHOD THEREOF

BACKGROUND OF THE INVENTION

1. Field of the Invention

The invention relates to a semiconductor device and a manufacturing method thereof, and more particularly, to a semiconductor device and a manufacturing method manufacturing method applied with strained-silicon technique.

2. Description of the Prior Art

With semiconductor processes entering the era of the deep submicron meter below 65 nanometer (nm), it has been more and more important to increase the metal-oxide semiconductor (MOS) drive current. To improve device performance, strained-silicon technique such as selective epitaxial growth (hereinafter abbreviated as SEG) method is developed to form epitaxial layers serving as the source/drain of the MOS. Because a lattice constant of the epitaxial layer is different from that of silicon, such characteristic is employed to cause alteration to the band structure of the silicon in the channel region. Accordingly, carrier mobility of the channel region is enhanced and thus device performance is improved.

Those skilled in the art have well known that the conventional MOS applied with SEG method is to form a disposal spacer on sidewalls of the gate structure or on a first spacer of the gate structure in order to define positions for forming recesses. Subsequently, recesses are formed and followed by performing a SEG method. Thus, epitaxial layers are formed in each recess. Thereafter the disposal spacer is removed and an ion implantation is subsequently performed to implant dopants of required conductivity type into the epitaxial layers. Accordingly, source/drain having the epitaxial layer are obtained. The epitaxial layers formed in the source/drain region render compressive or tensile stress to the channel region and thus the carrier mobility in the channel region is enhanced.

However, as size of the semiconductor structure keeps shrinking, semiconductor industries contrive to ensure that the device will not be impacted when forming or removing elements by which the device is constructed. For example, it has been found that the first spacer is always consumed and damaged when removing the disposal spacer. It even damages the profile of the gate structure when removing the disposal spacer. Furthermore, it is found that the size or profile of the second spacer and the source/drain are all adversely impacted when the first spacer is consumed. Seriously, it results that the following manufacturing processes fail to meet expectations.

Therefore, there is still a need for a manufacturing method for a semiconductor device that is able to protect elements of the semiconductor device from being impacted during removing the disposal spacer, and thus to ensure performance of the semiconductor device and the yield of the manufacturing method.

SUMMARY OF THE INVENTION

According to an aspect of the present invention, a manufacturing method for a semiconductor device is provided. The manufacturing method includes providing a substrate having at least a gate structure formed thereon, and a first spacer being formed on sidewalls of the gate structure; performing an ion implantation to implant dopants into the substrate; forming a disposal spacer on the sidewalls of the gate structure, the disposal spacer comprising at least a carbon-containing layer, and the carbon-containing layer contacting the first spacer; and performing a thermal treatment to form a protecting layer between the carbon-containing layer and the first spacer.

According to another aspect of the present invention, a manufacturing method for a semiconductor device is provided. The manufacturing method includes providing a substrate having at least a gate structure formed thereon, and a first spacer is formed on sidewalls of the gate structure. Then, at least a carbon-containing layer is formed on the substrate, the carbon-containing layer contacts the first spacer. After forming the carbon-containing layer, a thermal treatment is performed to form a protecting layer between the carbon-containing layer and the first spacer and followed by performing an etching back process to remove portions of the carbon-containing layer and of the protecting layer to form a disposal spacer on the sidewalls of the gate structure.

According to another aspect of the present invention, a semiconductor device is provided. The semiconductor device includes a gate structure, a first spacer positioned on sidewalls of the gate structure, a second spacer positioned on the first spacer, the second spacer comprising a silicon nitride layer and a carbon-containing layer, a SiCN-based protecting layer formed between the first spacer and the second spacer, and epitaxial layers respectively positioned at two sides of the second spacer.

According to the manufacturing method for the semiconductor device provided by the present invention, the thermal treatment is introduced to cause a reaction between the carbon-containing layer of the disposal spacer and the first spacer, so that a SiCN-based protecting layer is formed between the carbon-containing layer and the first spacer. Consequently, the SiCN-based protecting layer serves as an etching stop layer during removing the disposal spacer, and thus the underneath first spacer is protected from consumption. Since the first spacer remains unimpaired and impervious to the disposal spacer removal and possesses its original profile due to the SiCN-based protecting layer, the subsequent steps for forming elements such as the second spacer and the source/drain are performed successfully and the obtained second spacer and source/drain can meet the expectation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4 and FIGS. 8-10 are drawings illustrating a manufacturing method for a semiconductor device provided by a first preferred embodiment of the present invention, wherein FIG. 2 is a schematic drawing in a step subsequent to FIG. 1, FIG. 3 is a schematic drawing in a step subsequent to FIG. 2, and FIG. 4 is a schematic drawing in a step subsequent to FIG. 3.

FIGS. 5-7 and FIGS. 8-10 are drawings illustrating a manufacturing method for a semiconductor device provided by a second preferred embodiment of the present invention, wherein FIG. 6 is a schematic drawing in a step subsequent to FIG. 5, and FIG. 7 is a schematic drawing in a step subsequent to FIG. 6.

FIGS. 8-10 are schematic drawings in steps subsequent to FIGS. 4 and 7, wherein FIG. 8 is a schematic drawing in a step subsequent to FIGS. 4 and 7, FIG. 9 is a schematic drawing in a step subsequent to FIG. 8, and FIG. 10 is a schematic drawing in a step subsequent to FIG. 9.

FIGS. 11-15 are drawings illustrating a manufacturing method for a semiconductor device provided by a third preferred embodiment of the present invention, wherein FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, and FIG. 15 is a schematic drawing in a step subsequent to FIG. 14.

FIGS. 16-20 are drawings illustrating a manufacturing method for a semiconductor device provided by a fourth preferred embodiment of the present invention, wherein FIG. 17 is a schematic drawing in a step subsequent to FIG. 16, FIG. 18 is a schematic drawing in a step subsequent to FIG. 17, FIG. 19 is a schematic drawing in a step subsequent to FIG. 17, and FIG. 20 is a schematic drawing in a step subsequent to FIG. 19.

FIGS. 21-24 are drawings illustrating a manufacturing method for a semiconductor device provided by a fifth preferred embodiment of the present invention, wherein FIG. 22 is a schematic drawing in a step subsequent to FIG. 21, FIG. 23 is a schematic drawing in a step subsequent to FIG. 22, and FIG. 24 is a schematic drawing in a step subsequent to FIG. 23.

FIGS. 25-28 are drawings illustrating a manufacturing method for a semiconductor device provided by a sixth preferred embodiment of the present invention, wherein FIG. 26 is a schematic drawing in a step subsequent to FIG. 25, FIG. 27 is a schematic drawing in a step subsequent to FIG. 26, and FIG. 28 is a schematic drawing in a step subsequent to FIG. 27.

DETAILED DESCRIPTION

Figure 1:
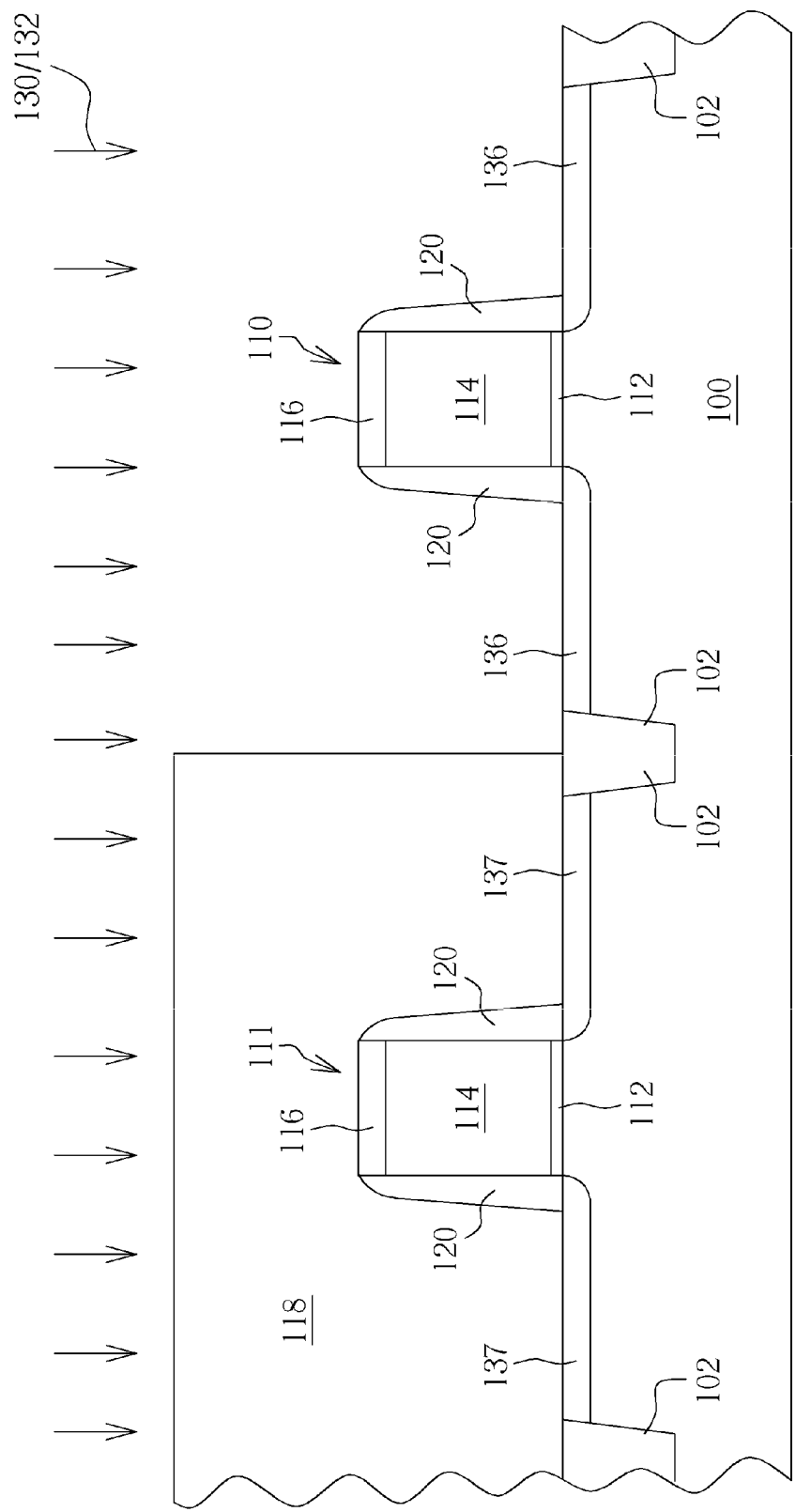

Please refer to FIGS. 1-4, which are drawings illustrating a manufacturing method for a semiconductor device provided by a first preferred embodiment of the present invention. As shown in FIG. 1, the preferred embodiment first provides a substrate 100 having a plurality of shallow trench isolations (STIs) 102 for providing electrical isolation formed therein. A first gate structure 110 and a second gate structure 111 are formed on the substrate 100. The first gate structure 110 and the second gate structure 111 include a gate dielectric layer 112, a gate conductive layer 114, and a cap layer 116 sequentially and upwardly stacked on the substrate 100. It is well-known to those skilled in the art that the cap layer 116 is formed to cover the gate conductive layer 114 to protect the gate conductive layer 114 from damage that may be caused in any process such as photolithograph process, ion implantation, etching process, or any needed cleaning process in the semiconductor fabricating process. Furthermore, a first spacer 120 is formed on sidewalls of the first gate structure 110 and the second gate structure 111, respectively. The first spacer 120 includes, for example but not limited to, a silicon nitride layer preferably formed by bis(tertiary-butylamino) silane (BTBAS). A width of the first spacer 120 is exemplarily 50 angstroms (Å), but not limited to this. Additionally, those skilled in the art would easily realize that the material and width of the first spacer 120 can be modified depending on different process or product requirements.

Please refer to FIG. 1 again. Next, an ion implantation (not shown) is performed to form second lightly-doped drains (LDDs) 137 in the substrate 100 respectively at two sides of the second gate structure 111. Then, a mask layer 118 is formed on the substrate 100 and followed by performing another ion implantation 130. Accordingly, dopants (not shown) are implanted into the substrate 100 at two sides of the first gate structure 110, particularly at two sides of the first spacer 120. Then, a thermal treatment 132 is performed to drive-in the dopants, such that first LDDs 136 are formed in the substrate 100 respectively at two sides of the first spacer 120 of the first gate structure 110. The conductivity types of the dopants for the first LDDs 136 and the second LDDs 137 are complementary to each other. For example, the first gate structure 110 is a p type gate structure and thus the dopants for forming the first LDDs 136 are p-type dopants such as boron (B) or boron difluoride ($BF_2$). The second gate structure 111 is an n type gate structure thus the dopants for forming the second LDDs 137 are n-type dopants such as phosphorous (P) or arsenic (Ar).

Figure 2:
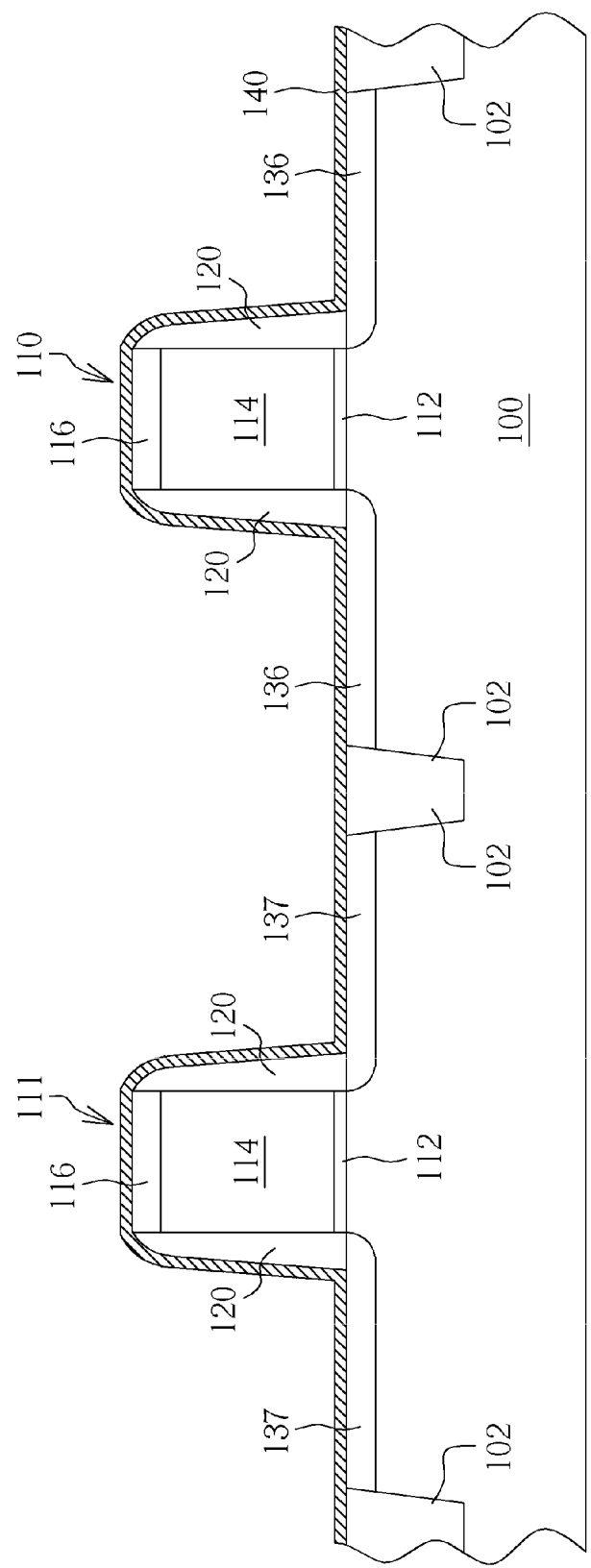

Please refer to FIG. 2. Subsequently, the mask layer 118 is removed and a protecting layer 140 is blanketly formed on the substrate 100, subsequently. The protecting layer 140 includes silicon carbon nitride based (SiCN-based) material. For example, the SiCN-based material can be SiCN or silicon oxycarbonitride (SiOCN), but not limited to this.

Figure 3:
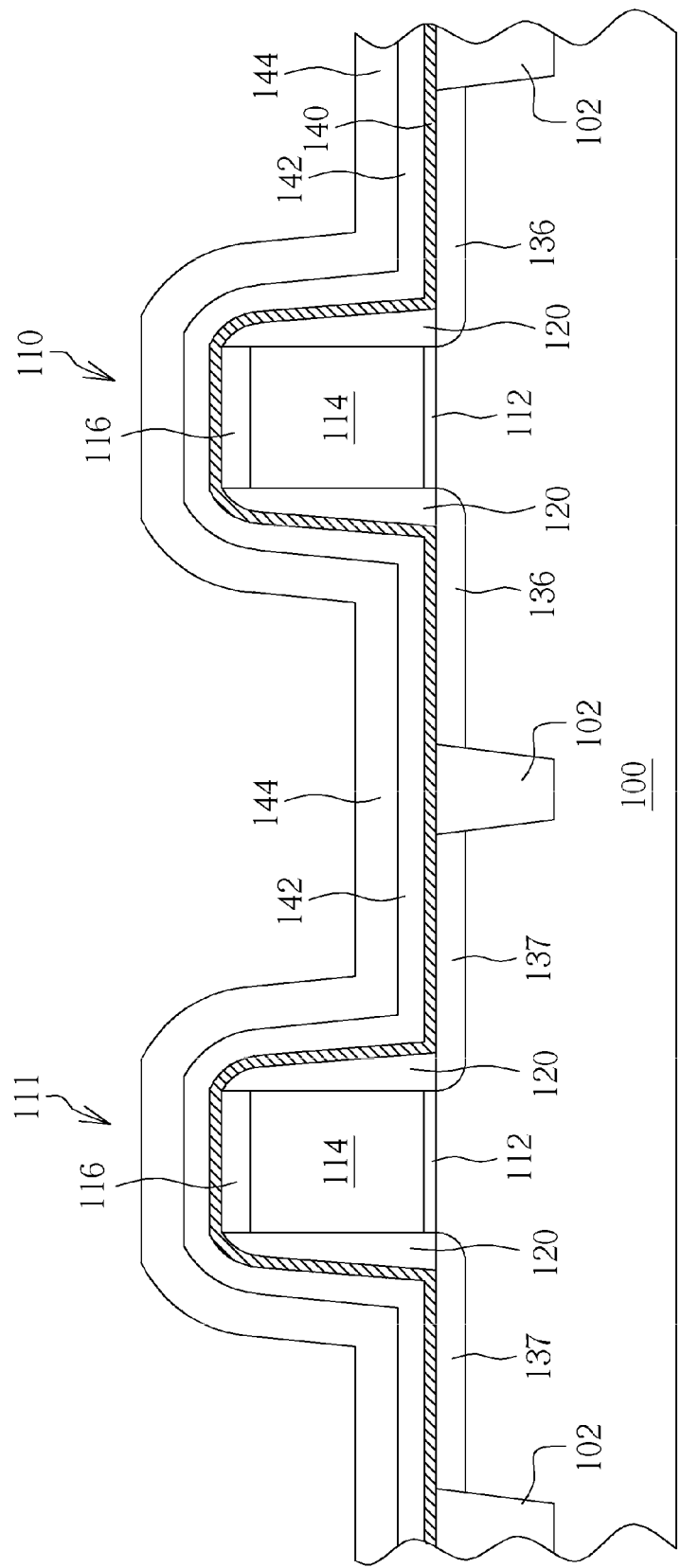

Please refer to FIG. 3. After forming the protecting layer 140, a carbon-containing layer 142 and a silicon nitride layer 144 are blanketly and sequentially formed on the substrate 100. In the preferred embodiment, the carbon-containing layer 142 includes, for example but not limited to, a layer formed by carbon source gas and hexachlorodisilane ($Si_2Cl_6$, HCD), and the silicon nitride layer 144 preferably includes a silicon nitride layer formed by HCD. Additionally, a thickness of the carbon-containing layer 142 is about 40 Å, and a thickness of the silicon nitride layer 144 is about 130 Å. However, the thickness of the carbon-containing layer 142 and of the silicon nitride layer 144 can be modified depending on different process requirements.

Figure 4:
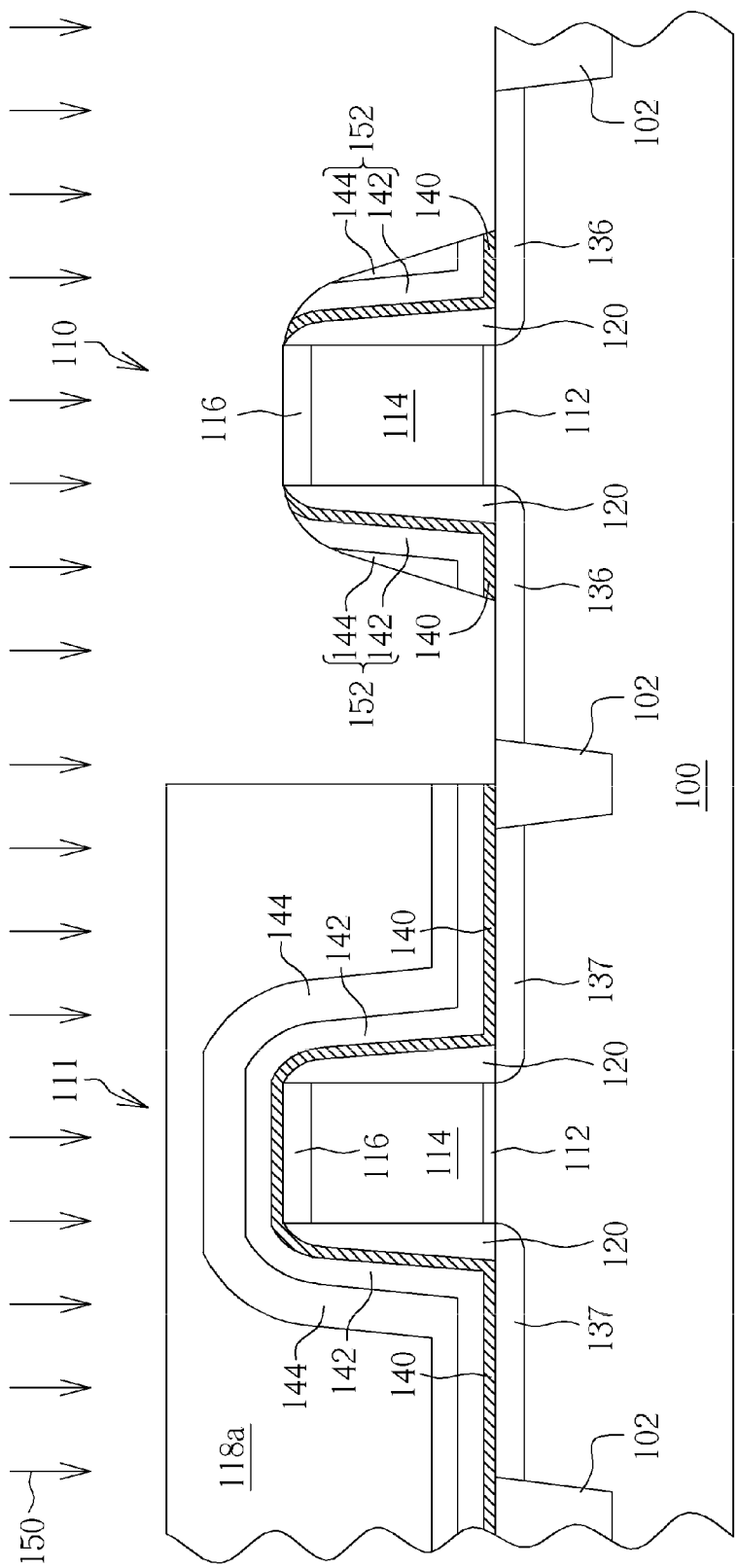

Please refer to FIG. 4. After forming the carbon-containing layer 142 and the silicon nitride layer 144, another mask layer 118a, such as a patterned photoresist, is formed to cover the second gate structure 111. Subsequently, an etching back process 150 is performed to form a disposal spacer 152 respectively on the sidewalls of the first gate structure 110, particularly on the first spacer 120. The disposal spacer 152 including the carbon-containing layer 142 and the silicon nitride layer 144 defines positions of recesses required by the SEG process at the two sides of the first gate structure 110. It is noteworthy that according to the preferred embodiment, the protecting layer 140 positioned between the disposal spacer 152 and the first spacer 120 includes an L shape as shown in FIG. 4.

Figure 5:
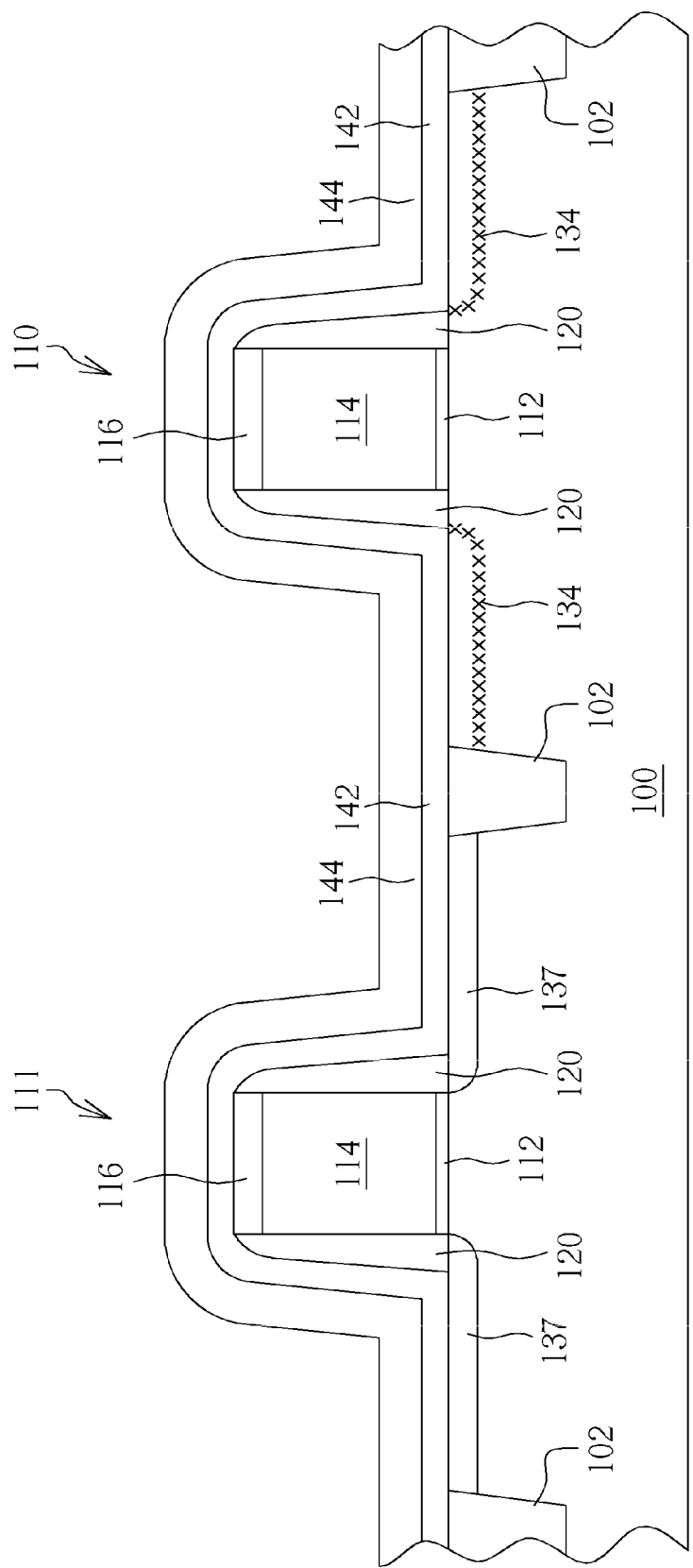

Please refer to FIGS. 5-10, which are drawings illustrating a manufacturing method for a semiconductor device provided by a second preferred embodiment of the present invention. It should be noted that elements the same in the first and second preferred embodiments are designated by the same numerals, and those elements can include the same materials. Thus those details are omitted hereinafter in the interest of brevity. As shown in FIG. 5, the preferred embodiment first provides a substrate 100 having a plurality of STIs 102 formed therein. A first gate structure 110 and a second gate structure 111 are formed on the substrate 100, and the first gate structure 110 and the second gate structure 111 include a gate dielectric layer 112, a gate conductive layer 114, and a cap layer 116 sequentially and upwardly stacked on the substrate 100. Furthermore, a first spacer 120 is formed on sidewalls of the first gate structure 110 and the second gate structure 111, respectively.

Please still refer to FIG. 5. Next, second LDDs 137 are formed in the substrate 100 at two sides of the second gate structure 111, respectively. Then, a mask layer (not shown) is formed on the substrate 100 and followed by performing an ion implantation (as shown in FIG. 1). Accordingly, dopants 134 are implanted into the substrate 100 at two sides of the first spacer 120 of the first gate structure. After the ion implantation, a carbon-containing layer 142 and a silicon nitride layer 144 are blanketly and sequentially formed on the substrate 100. As shown in FIG. 5, the carbon-containing layer 142 contacts the first spacer 120. In the preferred embodiment, the carbon-containing layer 142 can be a layer formed by carbon source gas and HCD and the silicon nitride layer 144 can be a silicon nitride layer formed by HCD. Additionally, a thickness of the carbon-containing layer 142 is about 40 Å, and a thickness of the silicon nitride layer 144 is about 130 Å. However, the thickness of the carbon-containing layer 142 and of the silicon nitride layer 144 can be modified depending on different process requirements.

Figure 6:
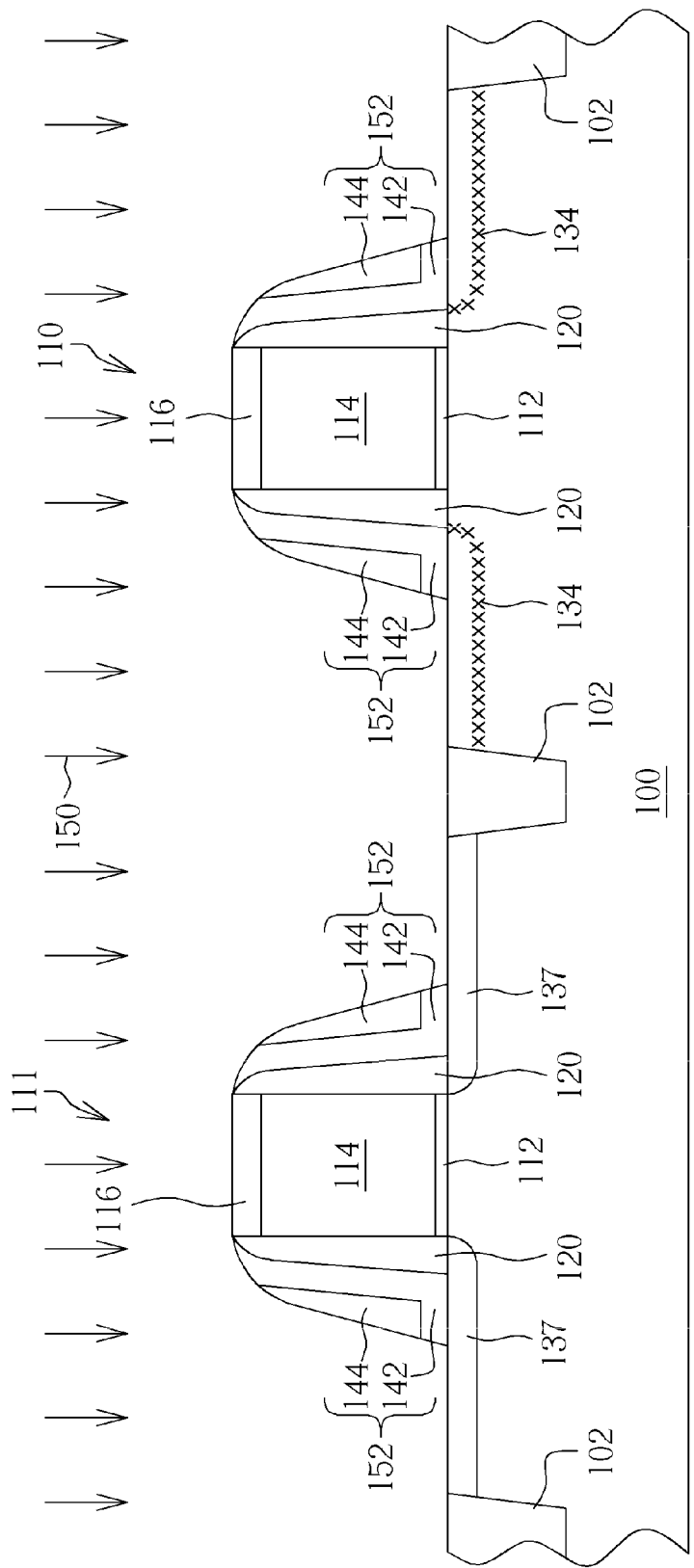

Please refer to FIG. 6. After forming the carbon-containing layer 142 and the silicon nitride layer 144, an etching back process 150 is performed to form a disposal spacer 152 respectively on the sidewalls of the first gate structure 110 and the second gate structure 111, particularly on the first spacer 120. The disposal spacer 152 including the carbon-containing layer 142 and the silicon nitride layer 144 defines positions of recesses required by the SEG process at the two sides of the first gate structure 110.

Figure 7:
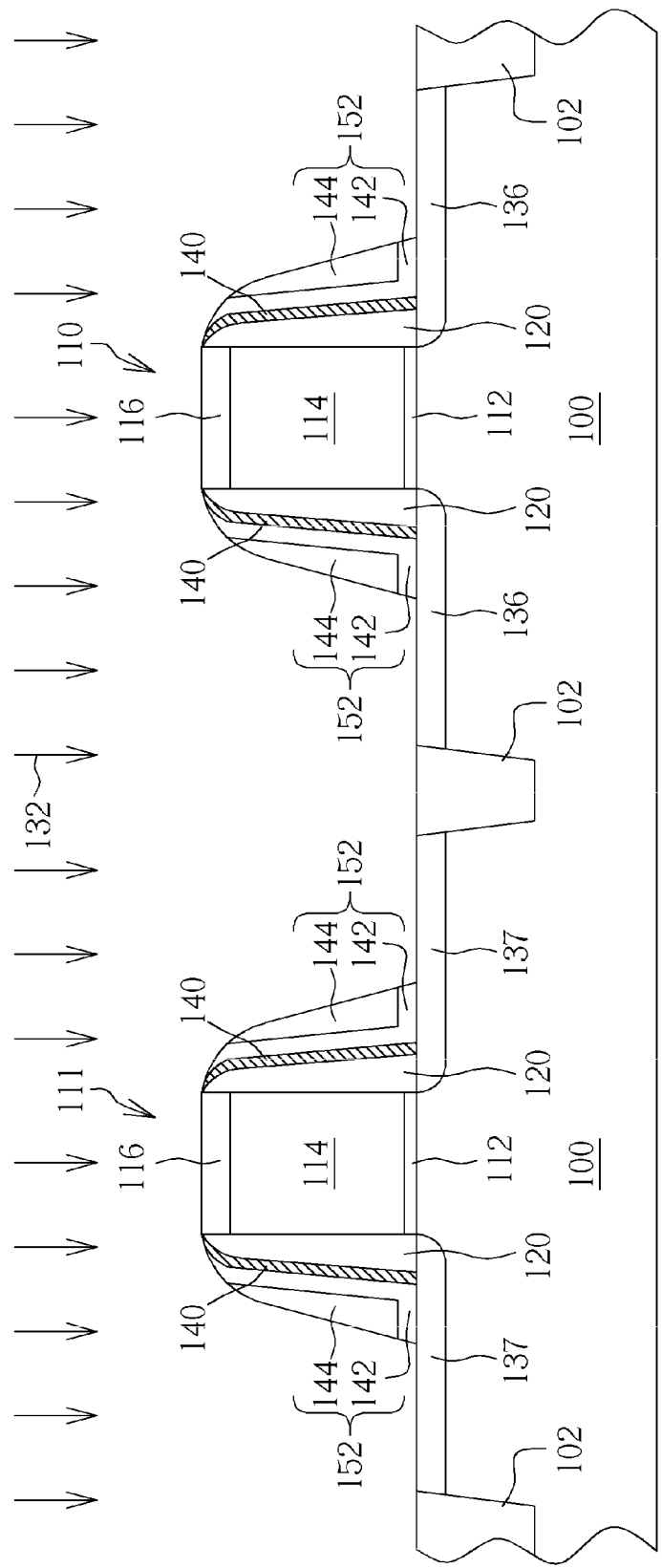

Please refer to FIG. 7. Next, a thermal treatment 132 is performed to cause a thermal reaction between the carbon-containing layer 142 and the first spacer 120. In other words, the carbon-containing layer 142 reacts with the first spacer 120 and thus a protecting layer 140 is formed between the carbon-containing layer 142 and the first spacer 120. In the preferred embodiment, the thermal treatment 132 includes a spike rapid thermal process (spike RTP), and a process temperature of the thermal treatment 132 is between 850° C. and 1000° C. It is noteworthy that since the protecting layer 140 is obtained by reaction between the carbon-containing layer 142 and the first spacer 120 which includes silicon nitride, the protecting layer 140 includes SiCN-based material such as SiCN or SiOCN, but not limited to this. Different from the first preferred embodiment, in which the protecting layer 140 is an L-shaped layer, the protecting layer 140 in the preferred embodiment, which is formed at the interface between the first spacer 120 and the carbon-containing layer 142 does not possess the L shape. More important, the thermal treatment 132 drives-in the dopants 134 in the substrate 100 to form first LDDs 136 simultaneously with forming the protecting layer 140.

Figure 8:
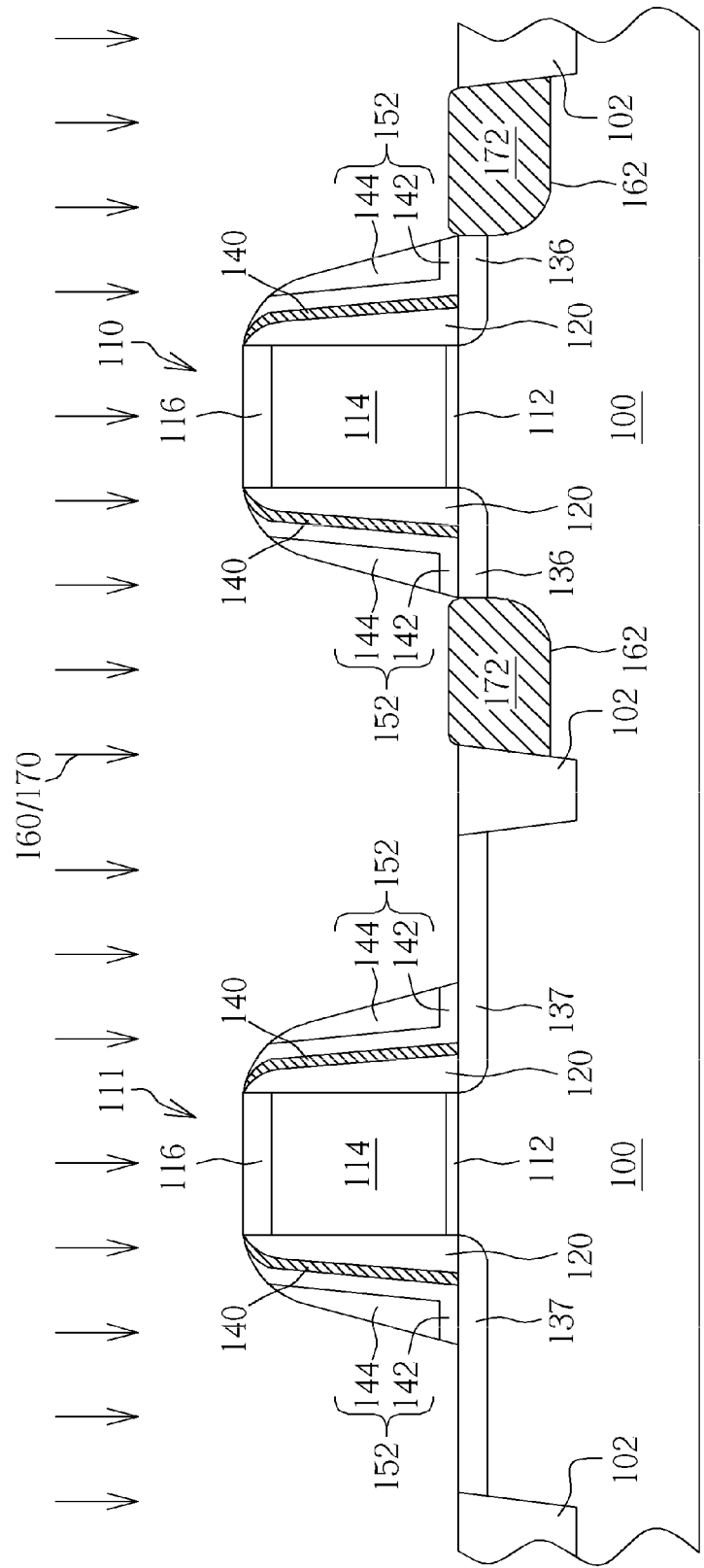
Figure 9:
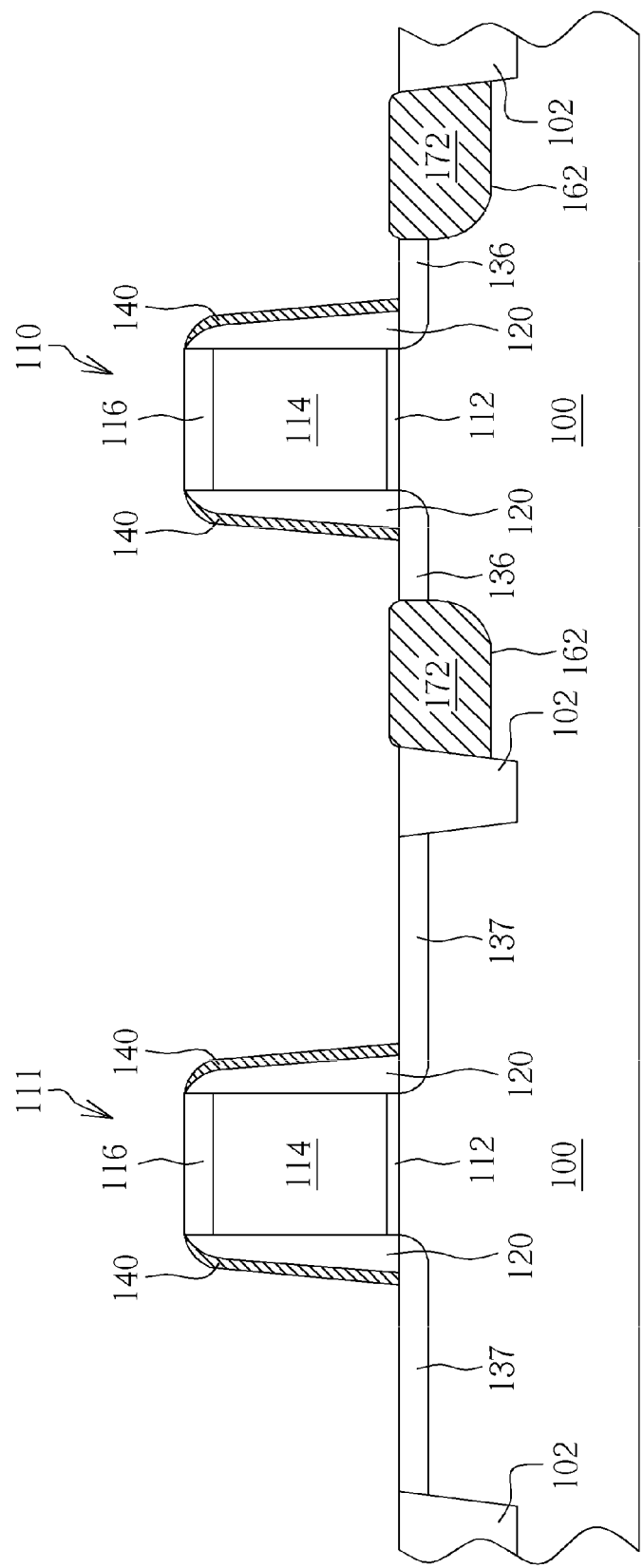
Figure 10:
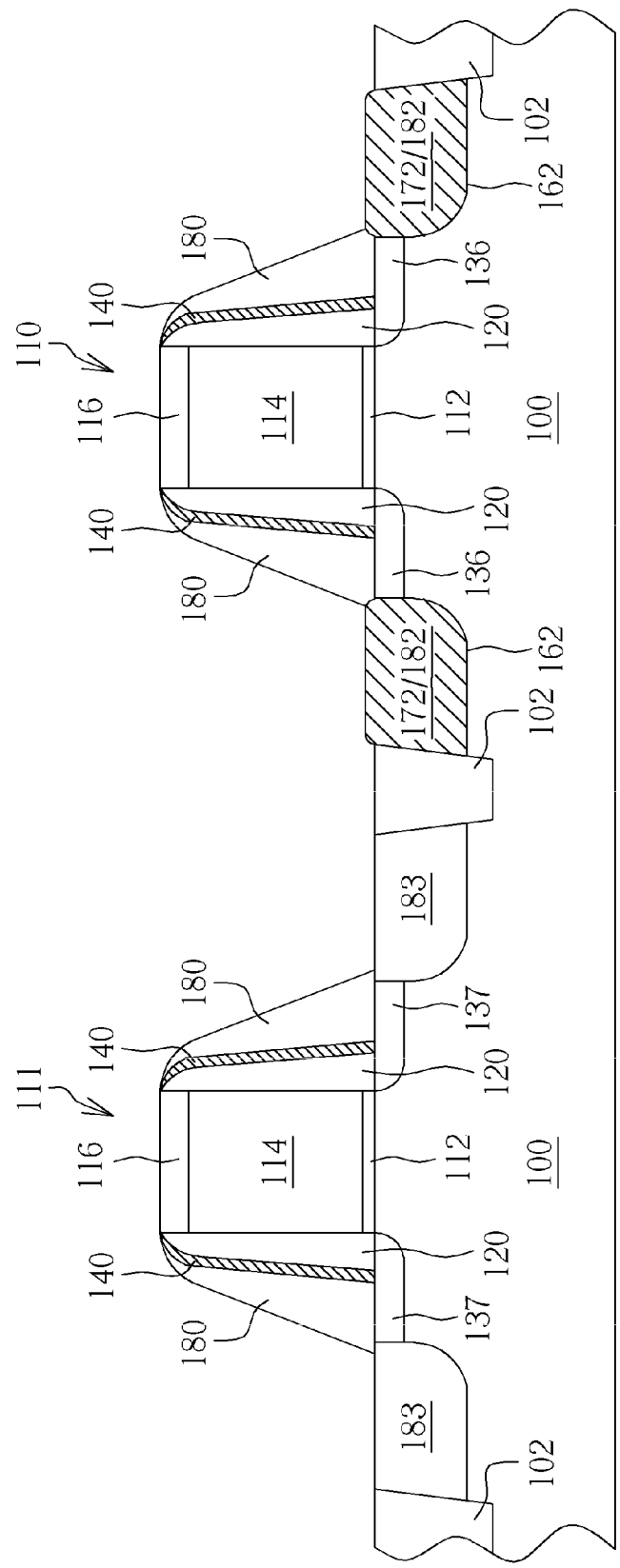

Please refer to FIGS. 8-10. It is noteworthy that steps depicted in FIGS. 8-10 are performed after forming the first LDDs 136 and the protecting layer 140 by the thermal treatment 132 in the second preferred embodiment, however those steps can also be performed after forming the disposal spacer 152 in the first preferred embodiment. As shown in FIG. 8, after performing the thermal treatment 132 to simultaneously form the protecting layer 140 and the first LDDs 136, another mask layer (not shown) is formed on the substrate 100. The mask layer, the cap layers 116, the disposal spacers 152, and the STIs 102 serve as an etching mask and an etching process 160 is performed to form a recess 162 in the substrate 100 respectively at two sides of the disposal spacer 152 of the first gate structure 110.

Please still refer to FIG. 8. After forming the recess 162, a pre-clean process is performed by using diluted hydrofluoric acid or SPM solution containing sulfuric acid, hydrogen peroxide, and deionized water to remove native oxides or other impurities from the surface of the recesses 162. Subsequently, a selective epitaxial growth (SEG) process 170 is performed to an epitaxial layer 172 such as an epitaxial silicon-germanium (SiGe) layer or an epitaxial silicon carbide (SiC) layer along the surface of the recess 162. Because a lattice constant of the epitaxial layers 172 is different from that of silicon, such characteristic is employed to cause alteration to the band structure of the silicon in the channel region. Accordingly, carrier mobility of the channel region of the semiconductor device is enhanced and thus device performance is improved. Subsequently, the mask layer is removed.

Please refer to FIG. 9. After forming the epitaxial layers 172, the disposal spacers 152 are removed. It is noteworthy that during removing the disposal spacers 152, the protecting layer 140 serves as an etching stop layer and protects the underneath first spacers 120. Accordingly, the first spacers 120 of both first gate structure 110 and the second gate structure 111 are impervious to the disposal spacer removal, and thus its profile and width are not consumed. As shown in FIG. 9, after removing the disposal spacers 152, the protecting layers 140 are exposed on the substrate 100.

Please refer to FIG. 10. After removing the disposal spacers 152, a second spacer 180 is respectively formed on the first gate structure 110 and the second gate structure 111, particularly on the exposed protecting layer 140, and followed by performing another ion implantation (not shown). Consequently, a first source/drain 182 is formed in the epitaxial layers 172 at two sides of the second spacer 180. And another ion implantation (not shown) is performed to form a second source/drain 183 in the substrate 100 at two sides of the second spacer 180 of the second gate structure 111. Since the details of forming the second spacer 180, the first source/drain 182, and the second source/drain 183 are well-known to those skilled in the art, those details are omitted in the interest of brevity.

Figure 11:
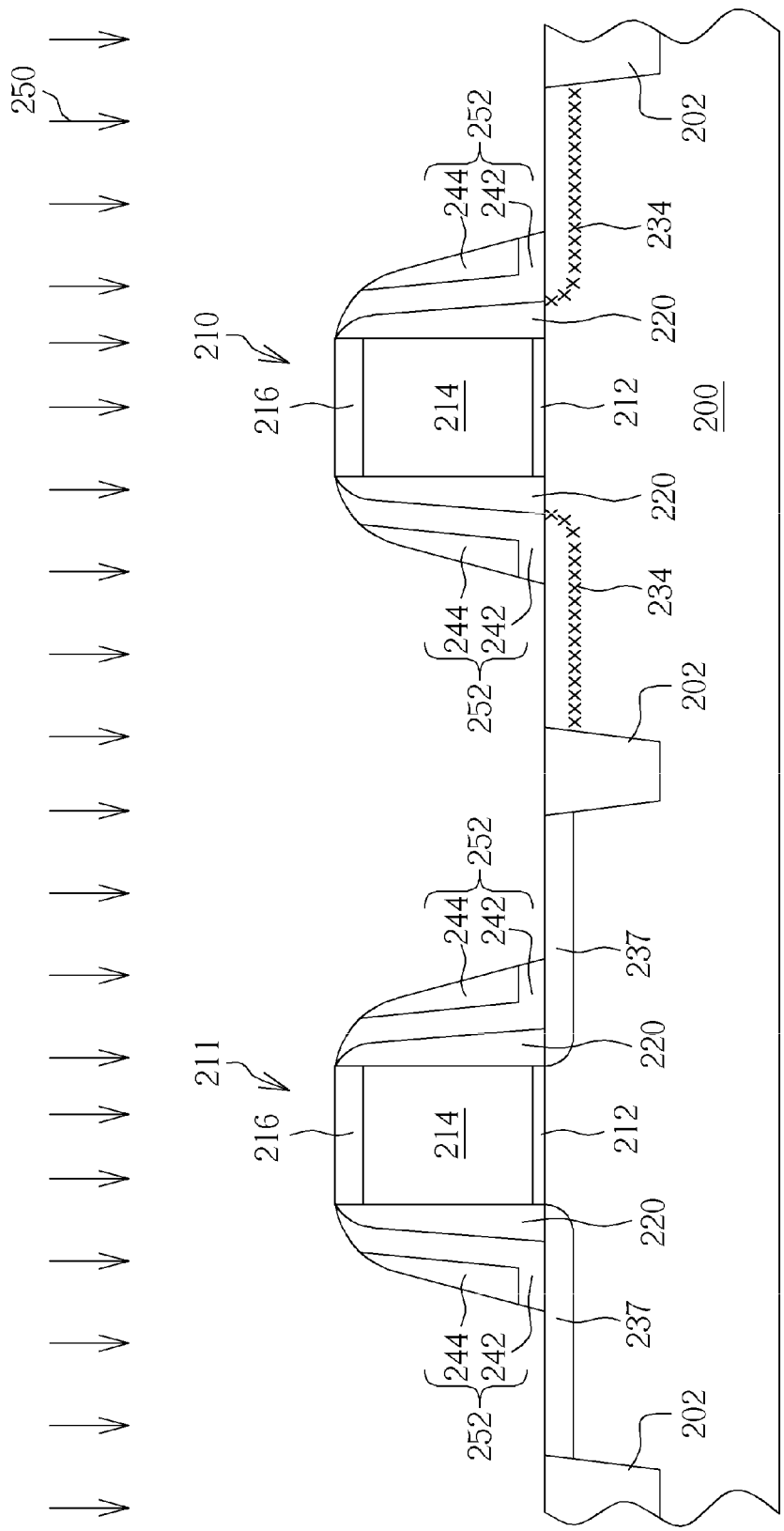

According to the manufacturing method for the semiconductor device provided by the first and second preferred embodiments, the SiCN-based protecting layers 140 are formed on the first spacer 120 before forming the disposal spacers 152 or formed between the carbon-containing layer 142 of the disposal spacer 152 and the first spacer 120 simultaneously with forming the first LDDs 136 by the thermal treatment 132. Since etching rate of the SiCN-based the protecting layer 140 is different from that of the disposal spacer 152 and of the first spacer 120, the SiCN-based protecting layer 140 protects the first spacer 120, and thus the width and the profile of the first spacer 120 are unimpaired and impervious during removing the disposal spacer 152. Additionally, the profile of the first gate structure 110 and the second gate structure 111 remains un-damaged. Therefore distances between the first source/drain 182, the first gate structure 110, and its channel region, and distances between the second source/drain 183, the second gate structure 111, and its channel region all meet the expectation. Hence, yield of the manufacturing method and reliability of the obtained semiconductor device are ensured without increasing process complexity.

Please refer to FIGS. 11-15, which are drawings illustrating a manufacturing method for a semiconductor device provided by a third preferred embodiment of the present invention. It is noteworthy that elements the same in the first, second, and third preferred embodiments can include the same materials. Those details are therefore omitted for simplicity. As shown in FIG. 11, the preferred embodiment first provides a substrate 200 having a plurality of STIs 202 for providing electrical isolation formed therein. A first gate structure 210 and a second gate structure 211 are formed on the substrate 200, and the first gate structure 210 and the second gate structure 211 include a gate dielectric layer 212, a gate conductive layer 214, and a cap layer 216 sequentially and upwardly stacked on the substrate 200. Furthermore, a first spacer 220 is formed on sidewalls of the first gate structure 210 and the second gate structure 211, respectively. A width of the first spacer 220 is exemplarily 50 Å, but not limited to this.

Please refer to FIG. 11 again. Next, second LDDs 237 are formed in the substrate 200 at two sides of the second gate structure 211, respectively. Then, a mask layer (not shown) is formed on the substrate 200 and followed by performing an ion implantation as described in the aforementioned preferred embodiments. Accordingly, dopants 234 are implanted into the substrate 200 at two sides of the first spacer 220. After performing the ion implantation, a carbon-containing layer 242 and a silicon nitride layer 244 are blanketly and sequentially formed on the substrate 200. As shown in FIG. 11, the carbon-containing layer 242 contacts the first spacer 220. In the preferred embodiment, the carbon-containing layer 242 can be a layer formed by carbon source gas and HCD and the silicon nitride layer 144 can be a silicon nitride layer formed by HCD. Additionally, a thickness of the carbon-containing layer 242 is about 40 Å, and a thickness of the silicon nitride layer 244 is about 130 Å. However, the thickness of the carbon-containing layer 242 and of the silicon nitride layer 244 can be modified depending on different process requirements.

Please still refer to FIG. 11. After forming the carbon-containing layer 242 and the silicon nitride layer 244, an etching back process 250 is performed to form a disposal spacer 252 respectively on the sidewalls of the first gate structure 210 and the second gate structure 211, particularly on the first spacer 220. The disposal spacer 252 including the carbon-containing layer 242 and the silicon nitride layer 244 further defines positions of recesses required by the SEG process at the two sides of the first gate structure 210.

Figure 12:
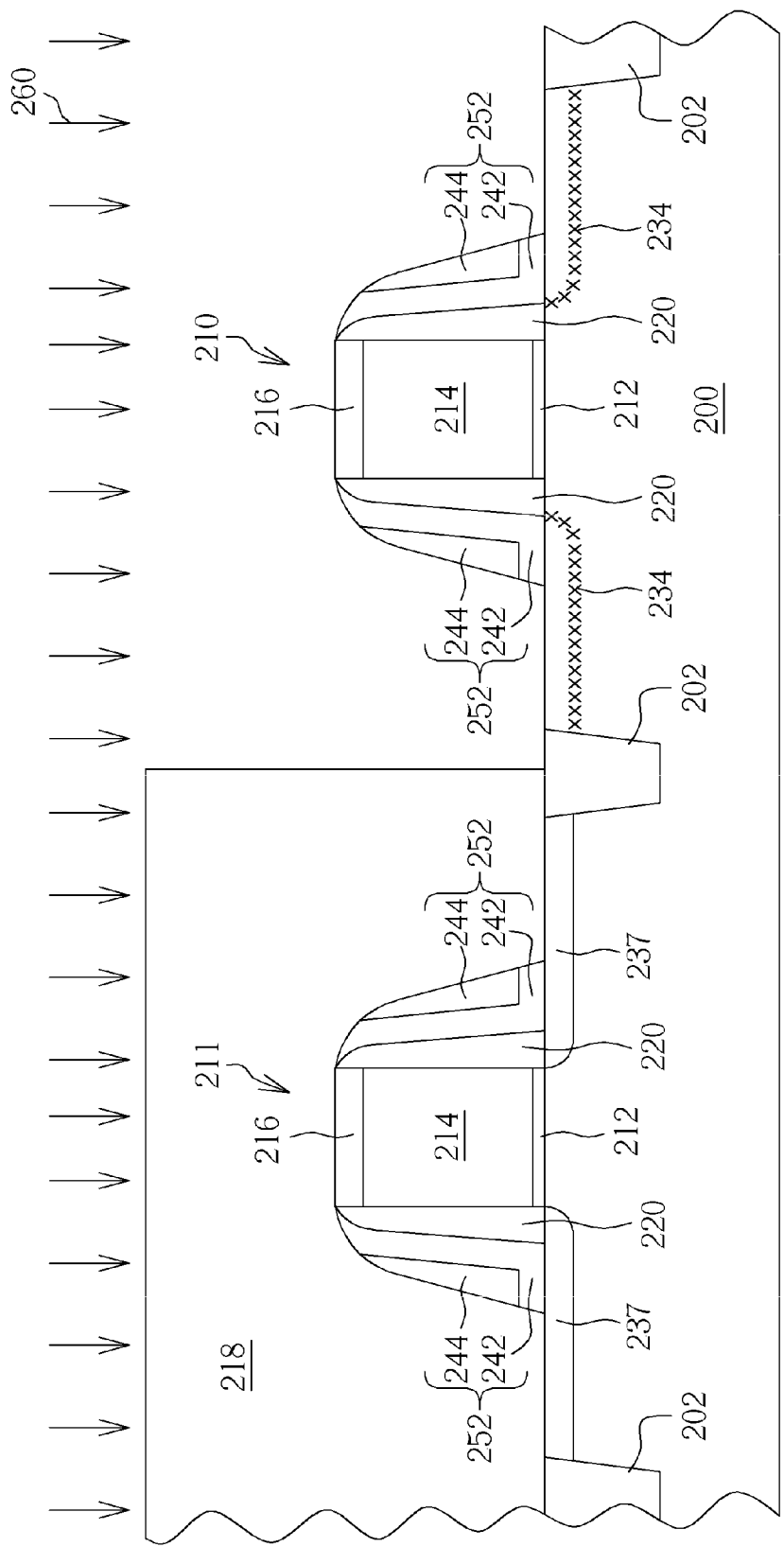

Please refer to FIG. 12. After forming the disposal spacer 252, a mask layer 218 is formed on the substrate 200. Subsequently, the mask layer 210, the cap layers 216, the disposal spacers 252, and the STIs 202 serve as an etching mask and an etching process 260 is performed to form a recess 262 in the substrate 200 respectively at two sides of the disposal spacer 252 of the first gate structure 210.

Figure 13:
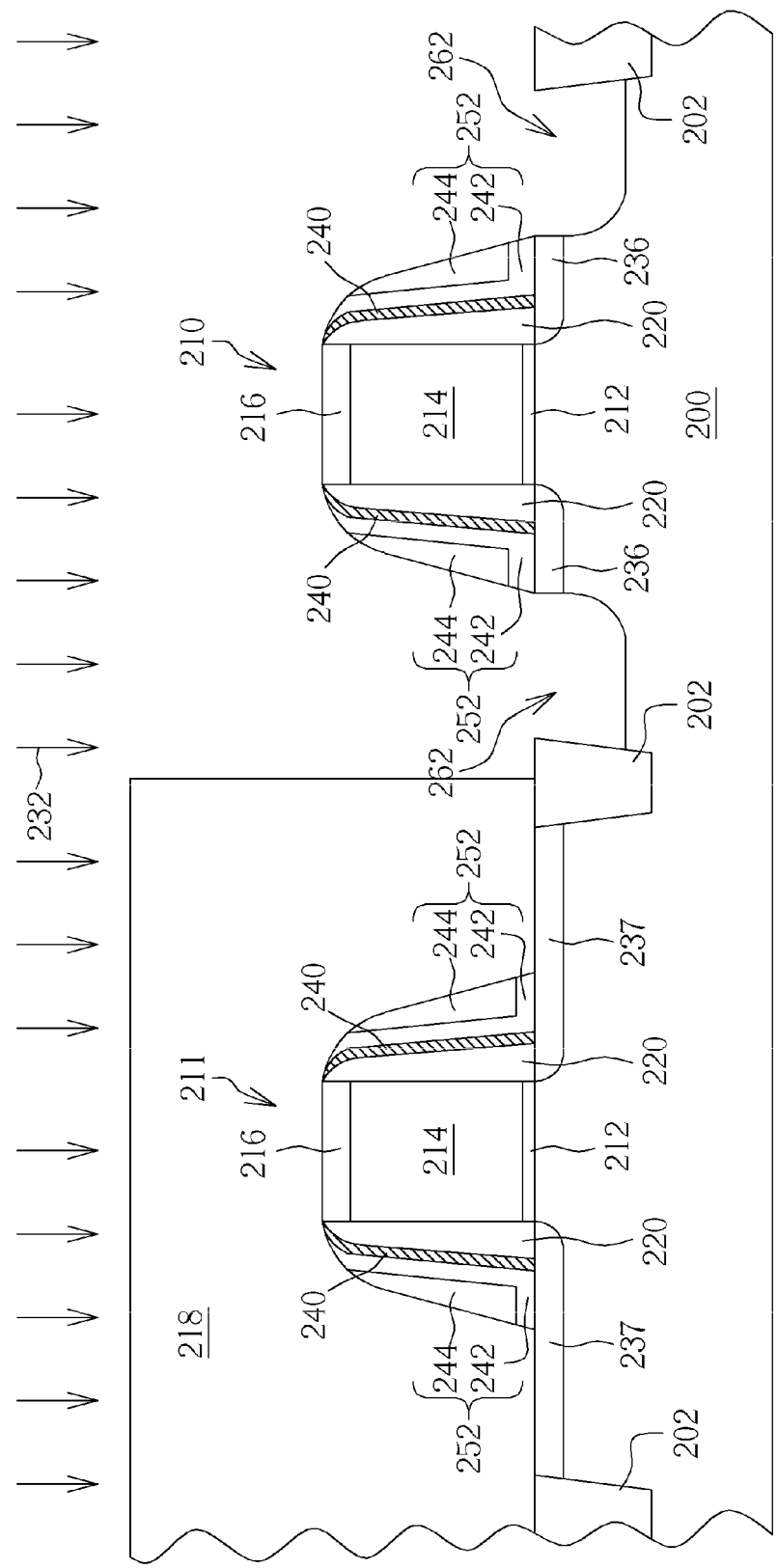

Please refer to FIG. 13. After the etching process 260, a thermal treatment 232 is performed to cause a thermal reaction between the carbon-containing layer 242 and the first spacer 220. In other words, the carbon-containing layer 242 reacts with the first spacer 220 and thus a protecting layer 240 is formed therebetween. The parameters of the thermal treatment 232 can be the same with those described in the aforementioned preferred embodiment, therefore those details are omitted for simplicity. It is noteworthy the protecting layer 240 is formed at the interface between the first spacer 220 and the carbon-containing layer 242 and includes SiCN-based material such as SiCN or SiOCN in accordance with the preferred embodiment. More important, the thermal treatment 232 drives-in the dopants 234 in the substrate 200 to form first LDDs 236 simultaneously with forming the protecting layer 240.

Figure 14:
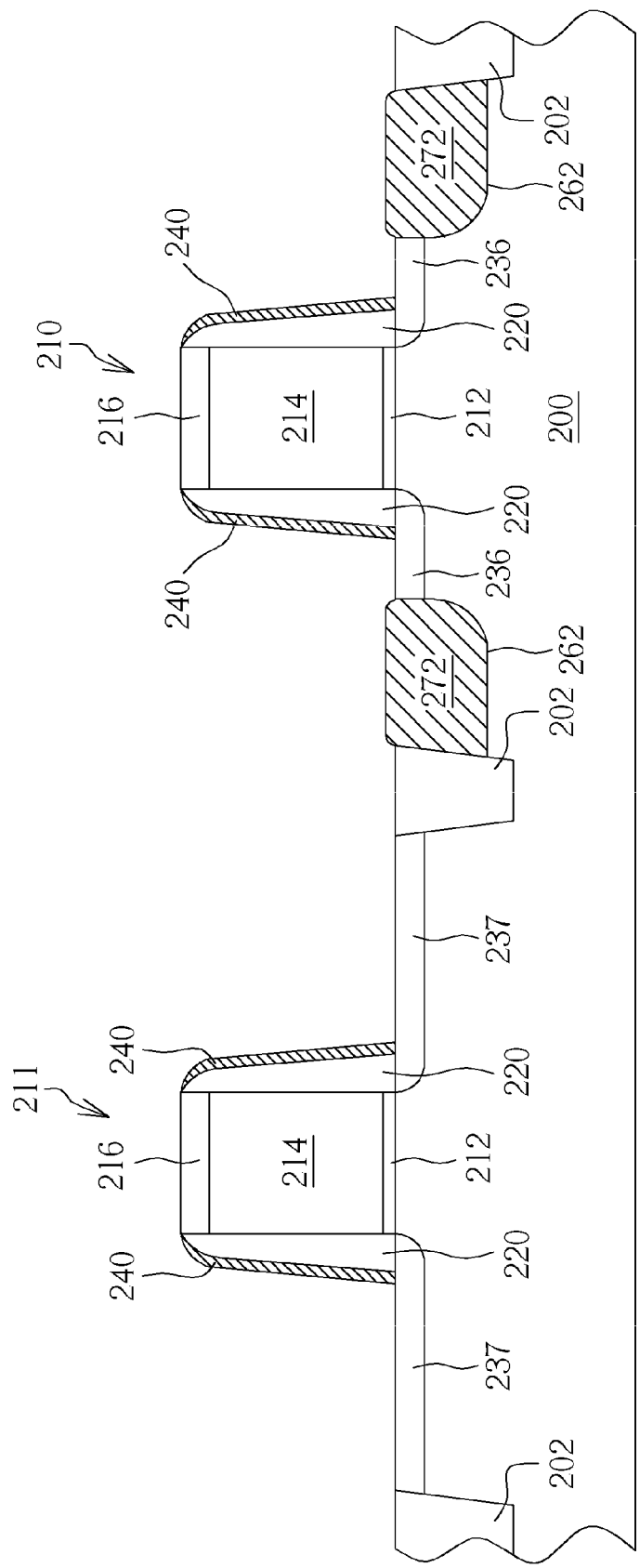

Please refer to FIG. 14. After the thermal treatment 232, a SEG process (as shown in FIG. 8) is performed to form an epitaxial layer 272 such as an epitaxial SiGe layer or an epitaxial SiC layer along the surface of the recess 262. After forming the epitaxial layers 272, the disposal spacers 252 are removed. It is noteworthy that during removing the disposal spacers 252, the protecting layer 240 serves as an etching stop layer and protects the underneath first spacer 220. Accordingly, the first spacers 220 are impervious to the disposal spacer removal, and thus its profile and width are not consumed. As shown in FIG. 14, after removing the disposal spacers 252, the protecting layers 240 are exposed on the substrate 200.

Figure 15:
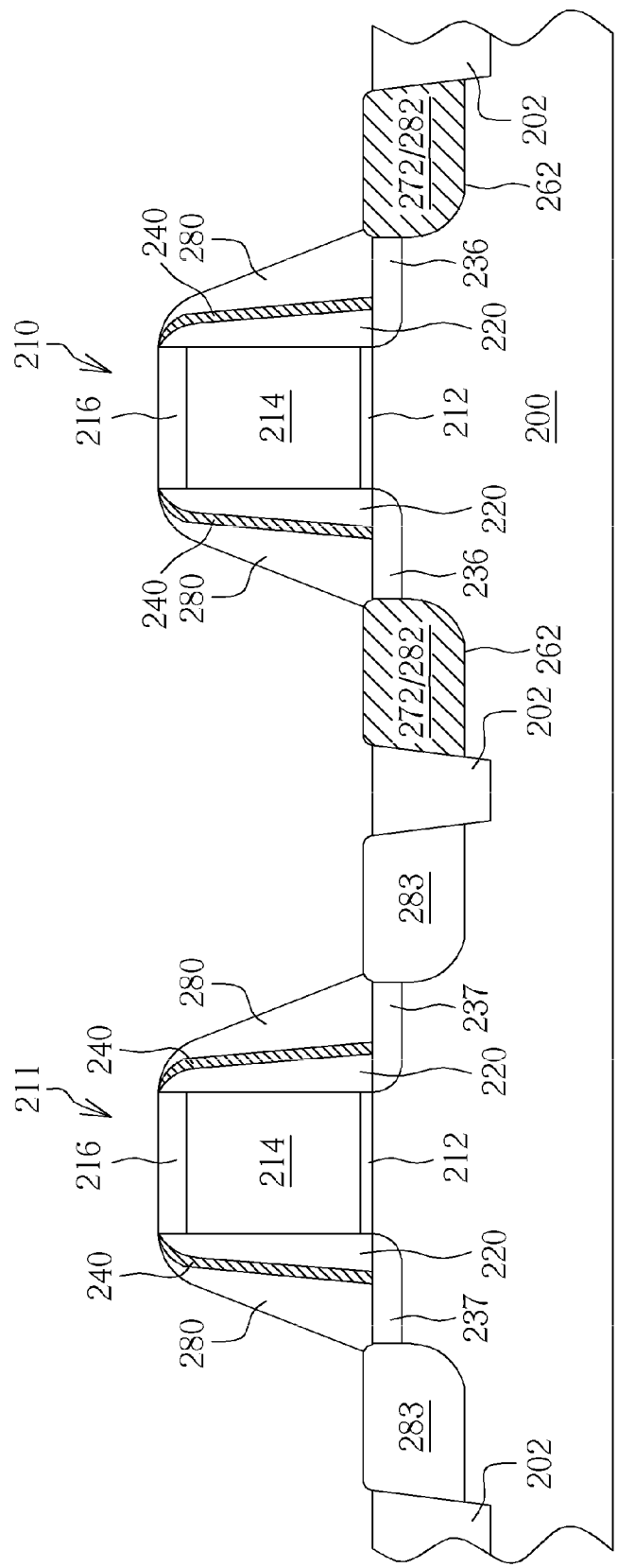

Please refer to FIG. 15. After removing the disposal spacer 252, a second spacer 280 is respectively formed on the first gate structure 210 and second gate structure 211, particularly on the exposed protecting layer 240, and followed by performing another ion implantation (not shown). Consequently, a first source/drain 282 is formed in the epitaxial layers 272 at two sides of the second spacer 280. And another ion implantation (not shown) is performed to form a second source/drain 283 in the substrate 200 at two sides of the second spacer 280 of the second gate structure 211. Since the details of forming the second spacer 280, the first source/drain 282, and the second source/drain 283 are well-known to those skilled in the art, those details are omitted for simplicity.

According to the manufacturing method for the semiconductor device provided by the third preferred embodiment, the SiCN-based protecting layer 240 is formed in the SEG-related processes, particularly formed after the etching process 260 that is used to form the recesses 262. Simultaneously with forming the first LDDs 236 by the thermal treatment 232, the carbon-containing layer 242 of the disposal spacer 252 and the first spacer 220 react to form the SiCN-based protecting layer 240. Since etching rate of the SiCN-based the protecting layer 240 is different form that of the disposal spacer 252 and of the first spacer 220, the SiCN-based protecting layer 240 protects the first spacer 220, therefore the width and the profile of the first spacer 220 are unimpaired and impervious during removing the disposal spacers 252. Additionally, the profiles of the first gate structure 210 and the second gate structure 211 remain un-damaged. Therefore the distances between the first source/drain 282, the first gate structure 210, and its channel region and distances between the second source/drain 283, the second gate structure 211, and its channel region all meet the expectation. Hence, yield of the manufacturing method and reliability of the obtained semiconductor device are ensured without increasing process complexity.

Figure 16:
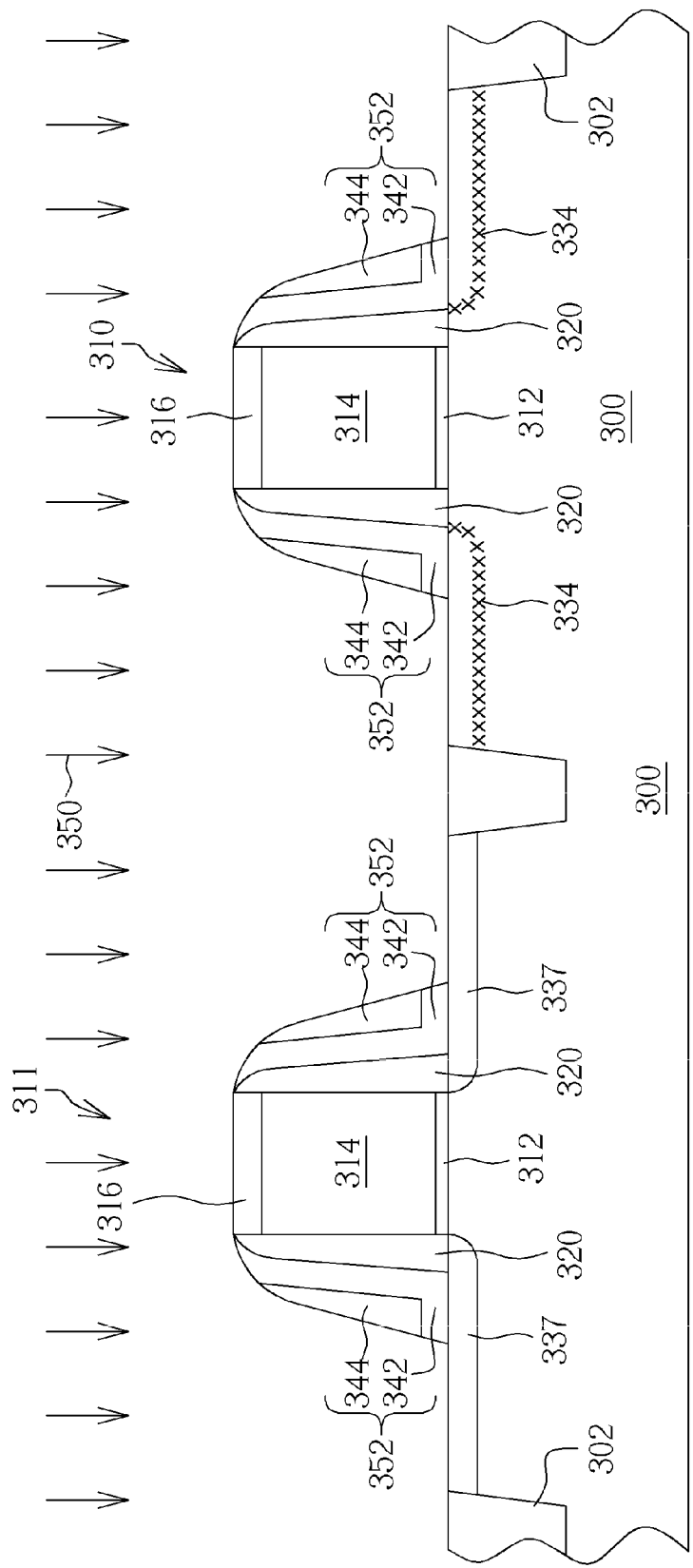

Please refer to FIGS. 16-20, which are drawings illustrating a manufacturing method for a semiconductor device provided by a fourth preferred embodiment of the present invention. It is noteworthy that elements the same in the first to fourth preferred embodiments can include the same materials. Those details are therefore omitted for simplicity. As shown in FIG. 16, the preferred embodiment first provides a substrate 300 having a plurality of STIs 302 for providing electrical isolation formed therein. A first gate structure 310 and a second gate structure 311 are formed on the substrate 300, and the first gate structure 310 and the second gate structure 311 include a gate dielectric layer 312, a gate conductive layer 314, and a cap layer 316 sequentially and upwardly stacked on the substrate 300. Furthermore, a first spacer 320 is formed on sidewalls of the first gate structure 310 and the second gate structure 311, respectively.

Please refer to FIG. 16 again. Next, second LDDs 337 are formed in the substrate 300 at two sides of the second gate structure 311, respectively. Then, a mask layer (not shown) is formed on the substrate 300 and followed by performing an ion implantation as described in the aforementioned preferred embodiments. Accordingly, dopants 334 are implanted into the substrate 300 at two sides of the first spacer 320 of the first gate structure 310. After the ion implantation, a carbon-containing layer 342 and a silicon nitride layer 344 are blanketly and sequentially formed on the substrate 300. As shown in FIG. 16, the carbon-containing layer 342 contacts the first spacer 320. In the preferred embodiment, the carbon-containing layer 342 can be a layer formed by carbon source gas and HCD and the silicon nitride layer 344 can be a silicon nitride layer formed by HCD. Additionally, a thickness of the carbon-containing layer 342 is about 40 Å, and a thickness of the silicon nitride layer 344 is about 130 Å. However, the thickness of the carbon-containing layer 342 and of the silicon nitride layer 344 can be modified depending on different process requirements.

Please still refer to FIG. 16. After forming the carbon-containing layer 342 and the silicon nitride layer 344, an etching back process 350 is performed to form a disposal spacer 352 respectively on the sidewalls of the first gate structure 310 and the second gate structure 311, particularly on the first spacer 320. The disposal spacer 352 including the carbon-containing layer 342 and the silicon nitride layer 344 further defines positions of recesses required by the SEG process at the two sides of the first gate structure 310.

Figure 17:
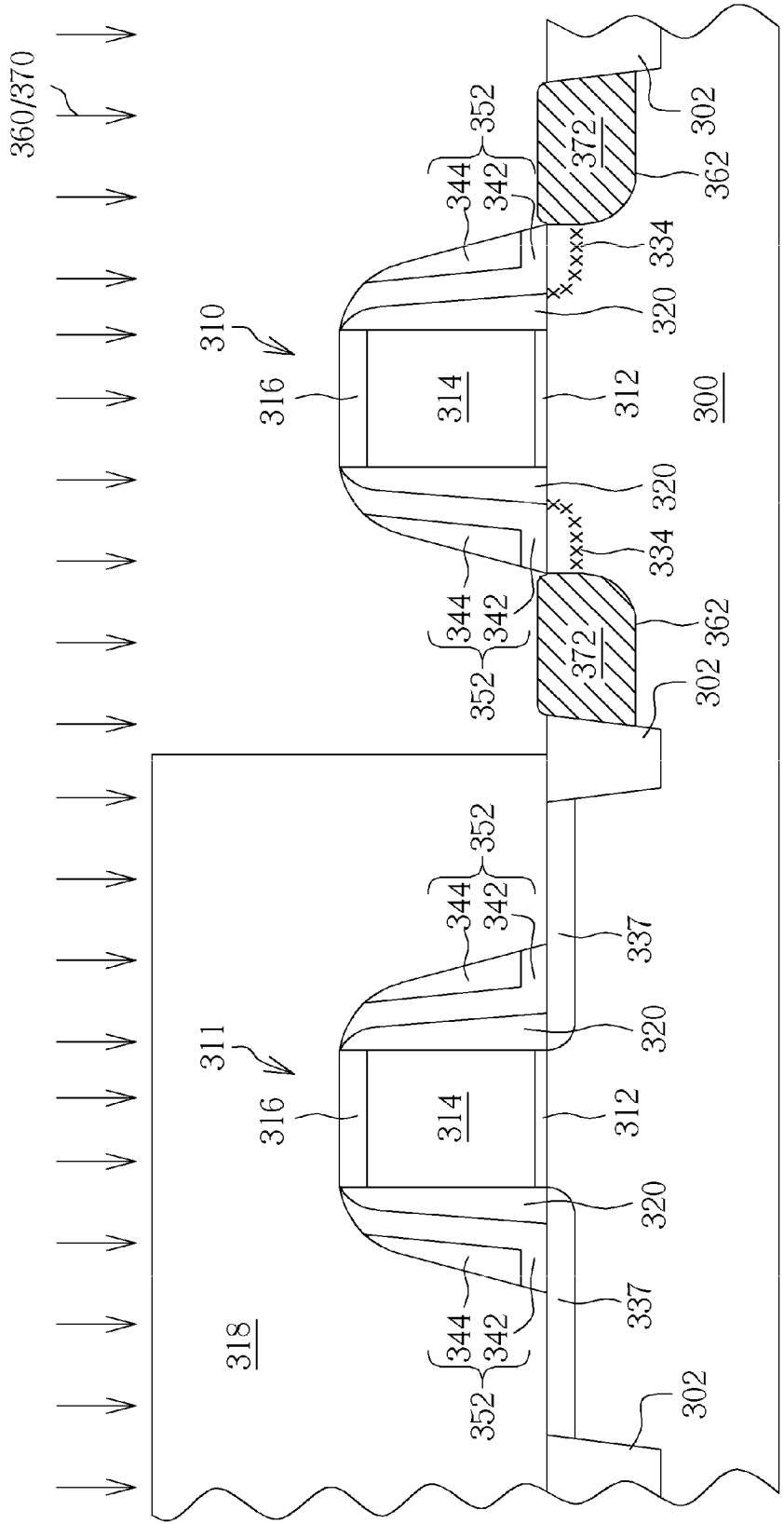

Please refer to FIG. 17. After forming the disposal spacer 352, another mask layer 318 is formed on the substrate 300. Subsequently, the mask layer 318, the cap layers 316, the disposal spacers 352, and the STIs 302 serve as an etching mask and an etching process 360 is performed to form a recess 362 in the substrate 200 respectively at two sides of the disposal spacer 352 of the first gate structure 310. Subsequently, a pre-clean process is performed to remove native oxides or other impurities from the surface of the recesses 362. Next, a SEG process 370 is performed to form an epitaxial layer 372 such as an epitaxial SiGe layer or an epitaxial SiC layer along the surface of the recess 362.

Figure 18:
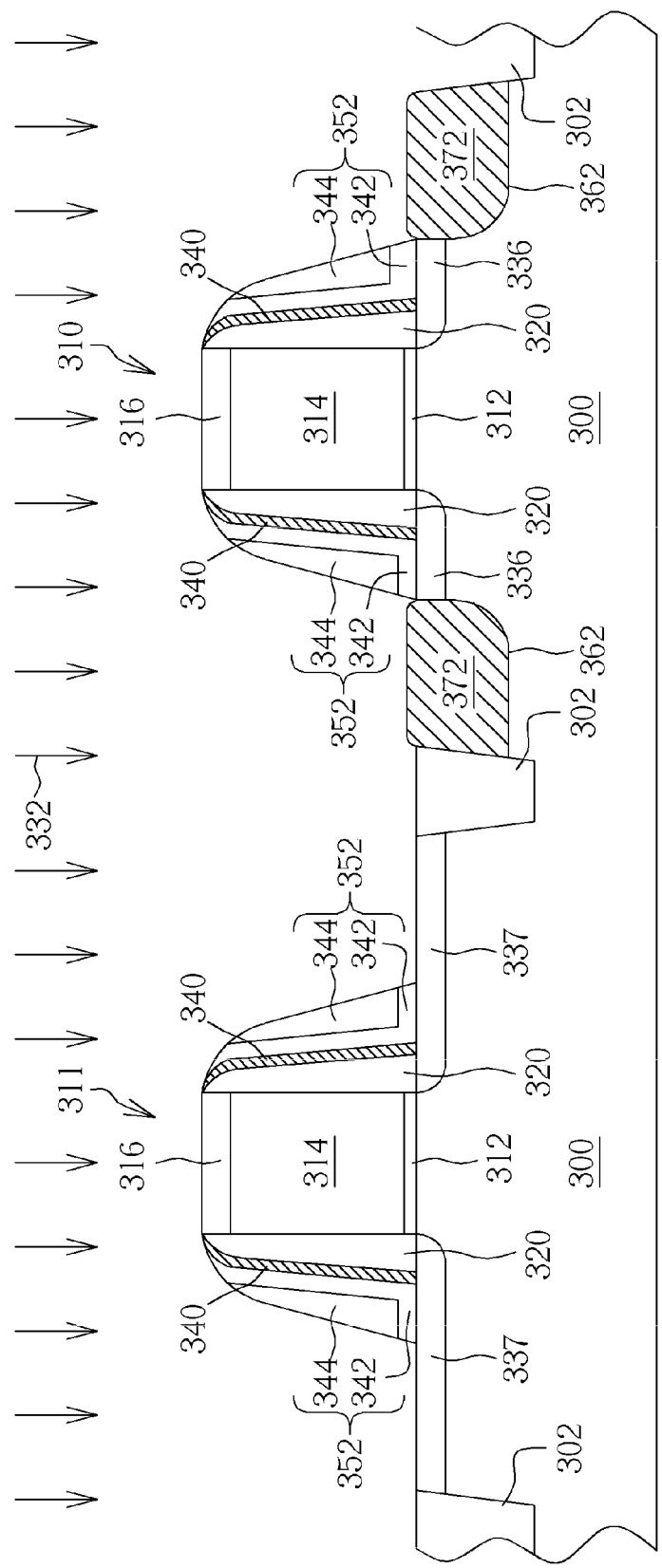

Please refer to FIG. 18. After performing the SEG process 370, the mask layer 318 is removed and a thermal treatment 332 is subsequently performed to cause a thermal reaction between the carbon-containing layer 342 and the first spacer 320. In other words, the carbon-containing layer 342 reacts with the first spacer 320 and thus a protecting layer 340 is formed therebetween. The parameters of the thermal treatment 332 can be the same with those described in the aforementioned preferred embodiments, therefore those details are omitted for simplicity. It is noteworthy the protecting layer 340 is formed at the interface between the first spacer 320 and the carbon-containing layer 342, and includes SiCN-based material such as SiCN or SiOCN in accordance with the preferred embodiment. More important, the thermal treatment 332 drives-in the dopants 334 in the substrate 300 to form first LDDs 336 simultaneously with forming the protecting layer 340.

Figure 19:
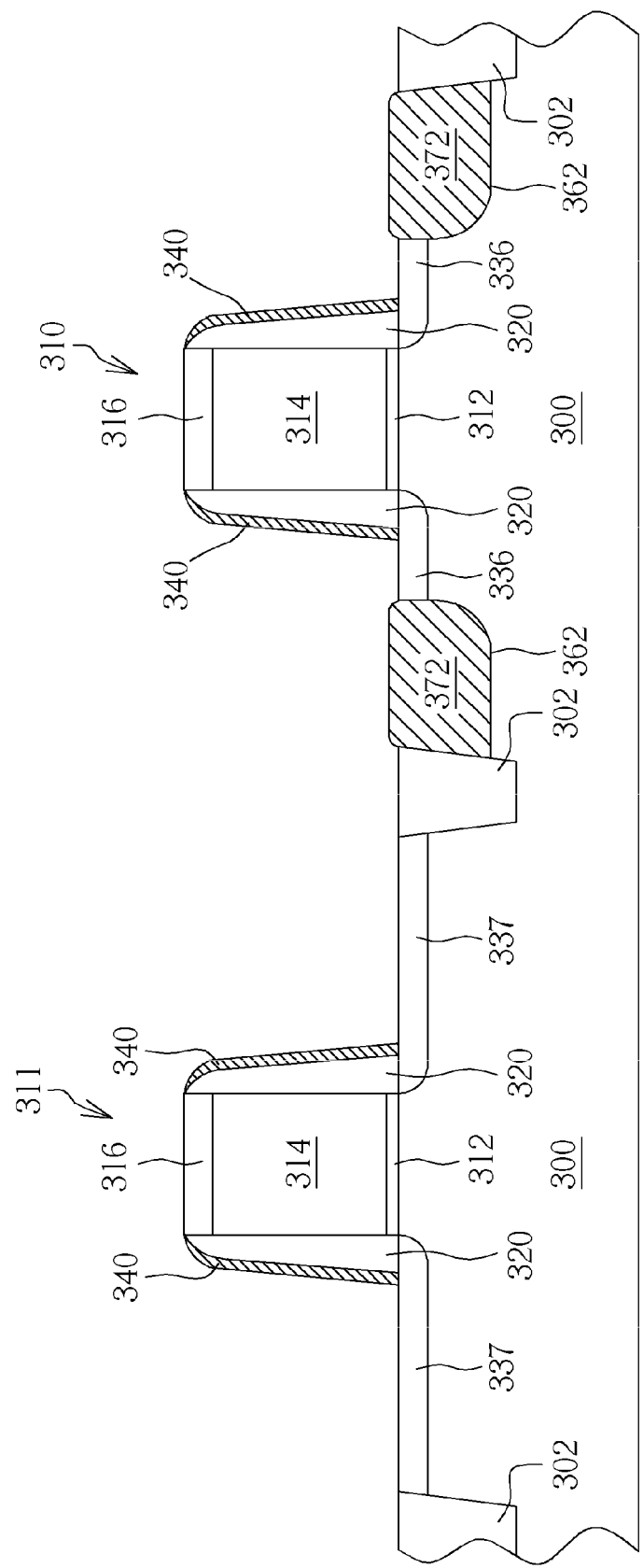

Please refer to FIG. 19. After performing the thermal treatment 332 to form the SiCN-based protecting layer 340 and the LDDs 336, the disposal spacers 352 are removed. It is noteworthy that during removing the disposal spacers 352, the protecting layer 340 serves as an etching stop layer and protects the underneath first spacer 320. Accordingly, the first spacers 320 are impervious to the disposal spacer removal, and thus its profile and width are not consumed. As shown in FIG. 19, after removing the disposal spacers 352, the protecting layers 340 are exposed on the substrate 300.

Figure 20:
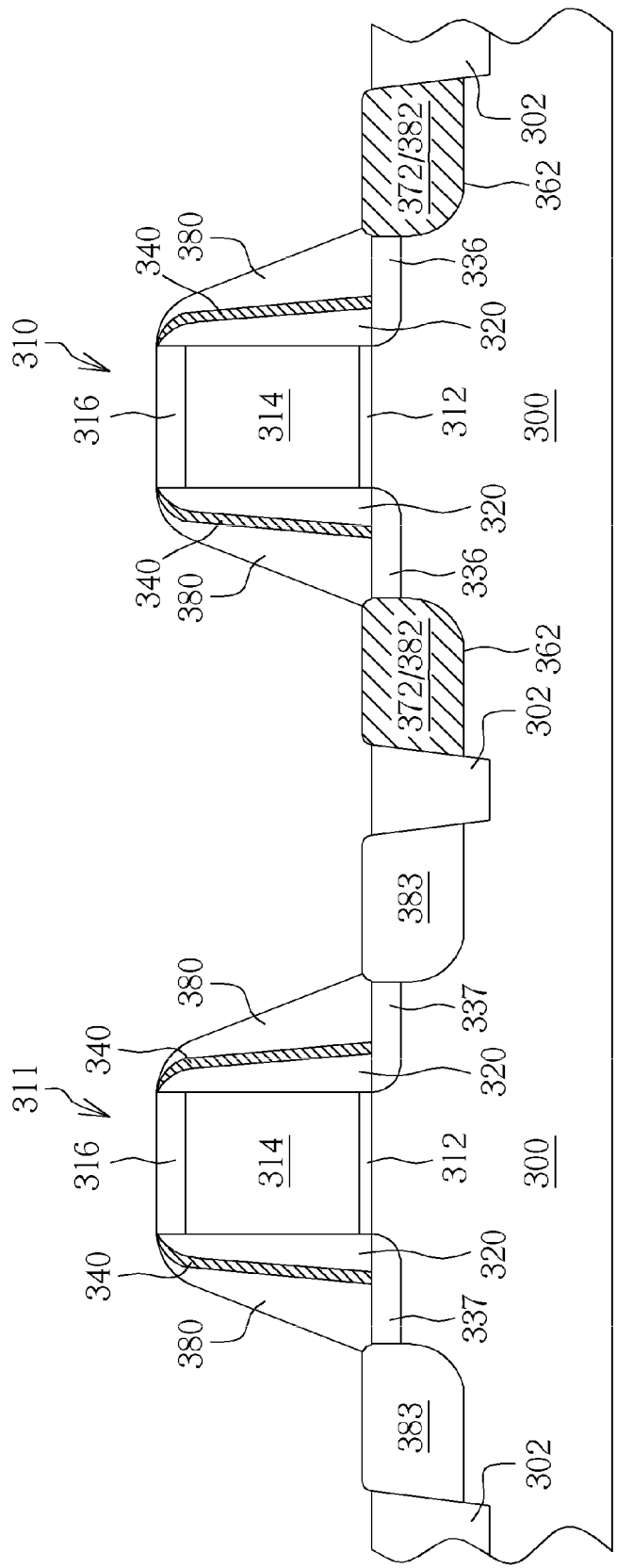

Please refer to FIG. 20. After removing the disposal spacer 352, a second spacer 380 is respectively formed on the first gate structure 310 and the second gate structure 311, particularly on the exposed protecting layer 340, and followed by performing another ion implantation (not shown). Consequently, a first source/drain 382 is formed in the epitaxial layers 372 at two sides of the second spacer 380. And another ion implantation (not shown) is performed to form a second source/drain 383 in the substrate 300 at two sides of the second spacer 380 of the second gate structure 311. Since the details of forming the second spacer 380, the first source/drain 382, and the second source/drain 383 are well-known to those skilled in the art, those details are omitted for simplicity.

According to the manufacturing method for the semiconductor device provided by the fourth preferred embodiment, the SiCN-based protecting layer 340 is formed after the SEG process 370. Simultaneously with forming the LDDs 336 by the thermal treatment 332, the carbon-containing layer 342 of the disposal spacer 352 and the first spacer 320 react to form the SiCN-based protecting layer 340. The SiCN-based protecting layer 340 protects the first spacer 320, therefore the width and the profile of the first spacer 320 are unimpaired and impervious during removing the disposal spacers 352. Additionally, the profile of the first gate structure 310 and the second gate structure 311 remains un-damaged. Therefore distances between the first source/drain 382, the first gate structure 310, and its channel region, and distances between the second source/drain 383, the second gate structure 311, and its channel region all meet the expectation. Hence, yield of the manufacturing method and reliability of the obtained semiconductor device are ensured without increasing process complexity.

Figure 21:
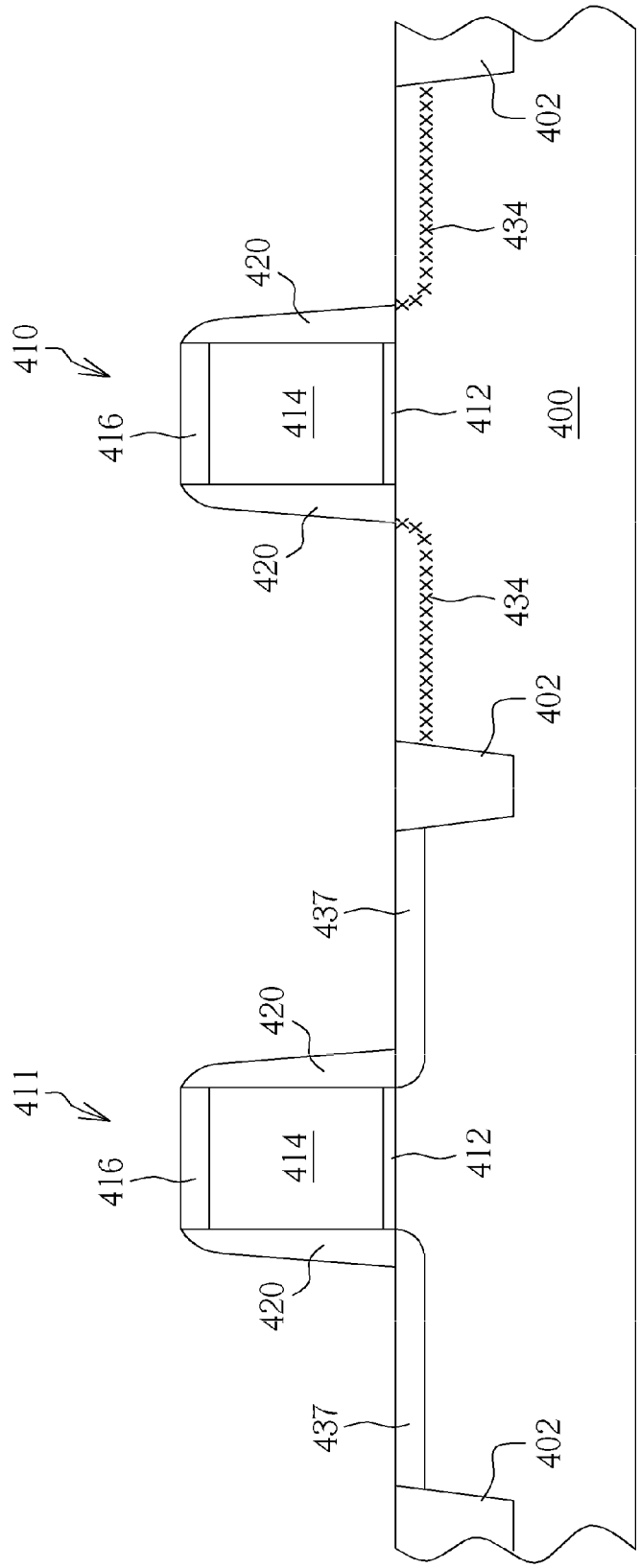

Please refer to FIGS. 21-24, which are drawings illustrating a manufacturing method for a semiconductor device provided by a fifth preferred embodiment of the present invention. It is noteworthy that elements the same in the first to fifth preferred embodiments can include the same materials. Those details are therefore omitted for simplicity. As shown in FIG. 21, the preferred embodiment first provides a substrate 400 having a plurality of STIs 402 for providing electrical isolation formed therein. A first gate structure 410 and a second gate structure 411 are formed on the substrate 400, and the first gate structure 410 and the second gate structure 411 include a gate dielectric layer 412, a gate conductive layer 414, and a cap layer 416 sequentially and upwardly stacked on the substrate 400. Furthermore, a first spacer 420 is formed on sidewalls of the first gate structure 410 and the second gate structure 411, respectively. A width of the first spacers 420 is about 50 Å, but not limited to this.

Please still refer to FIG. 21. Next, second LDDs 437 are formed in the substrate 400 at two sides of the second gate structure 411, respectively. Then, a mask layer (not shown) is formed on the substrate 400 and followed by performing an ion implantation as described in the aforementioned preferred embodiments. Accordingly, dopants 434 are implanted into the substrate 400 at two sides of the first spacer 420 of the first gate structure 410.

Figure 22:
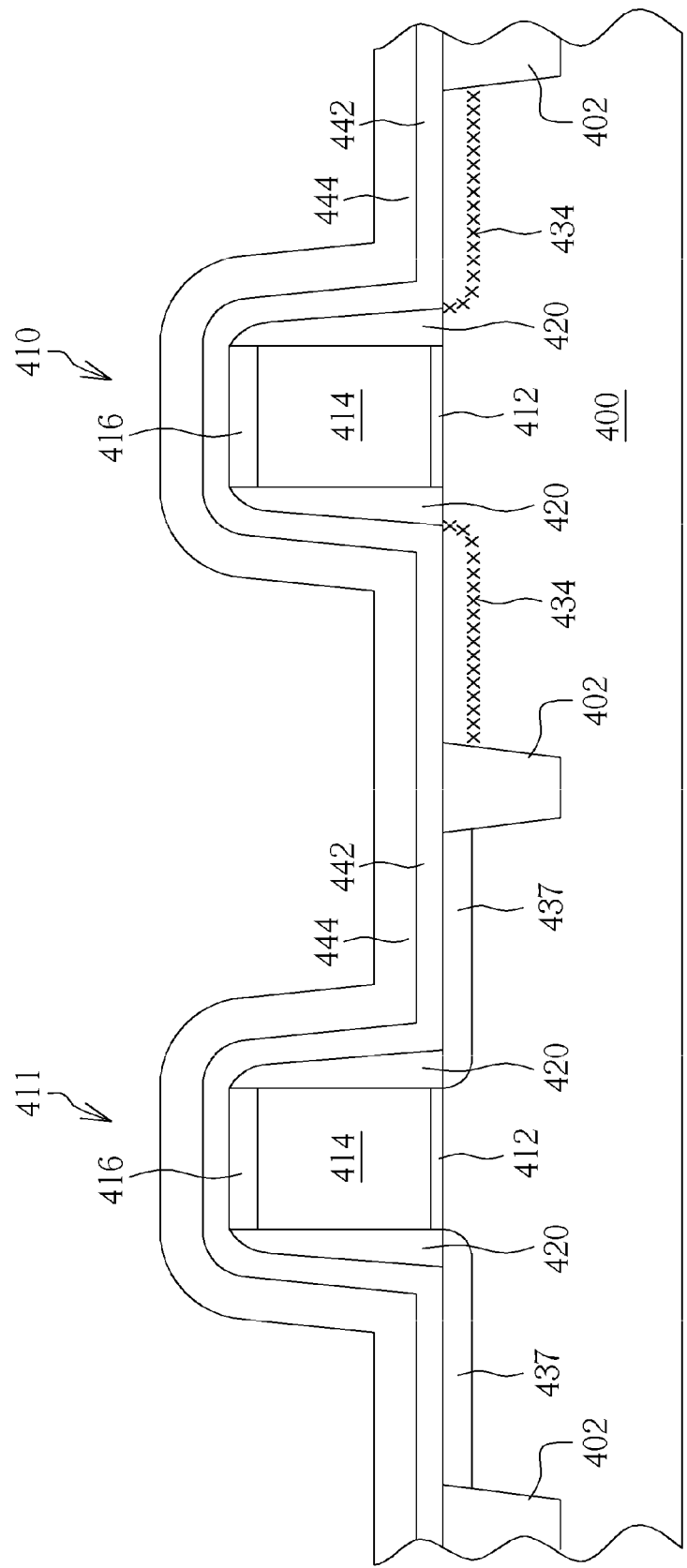

Please refer to FIG. 22. After the ion implantation, a carbon-containing layer 442 and a silicon nitride layer 444 are blanketly and sequentially formed on the substrate 400. As shown in FIG. 22, the carbon-containing layer 442 contacts the first spacer 420. In the preferred embodiment, the carbon-containing layer 442 can be a layer formed by carbon source gas and HCD and the silicon nitride layer 444 can be a silicon nitride layer formed by HCD. Additionally, a thickness of the carbon-containing layer 442 is about 40 Å, and a thickness of the silicon nitride layer 444 is about 130 Å. However, the thickness of the carbon-containing layer 442 and of the silicon nitride layer 444 can be modified depending on different process requirements.

Figure 23:
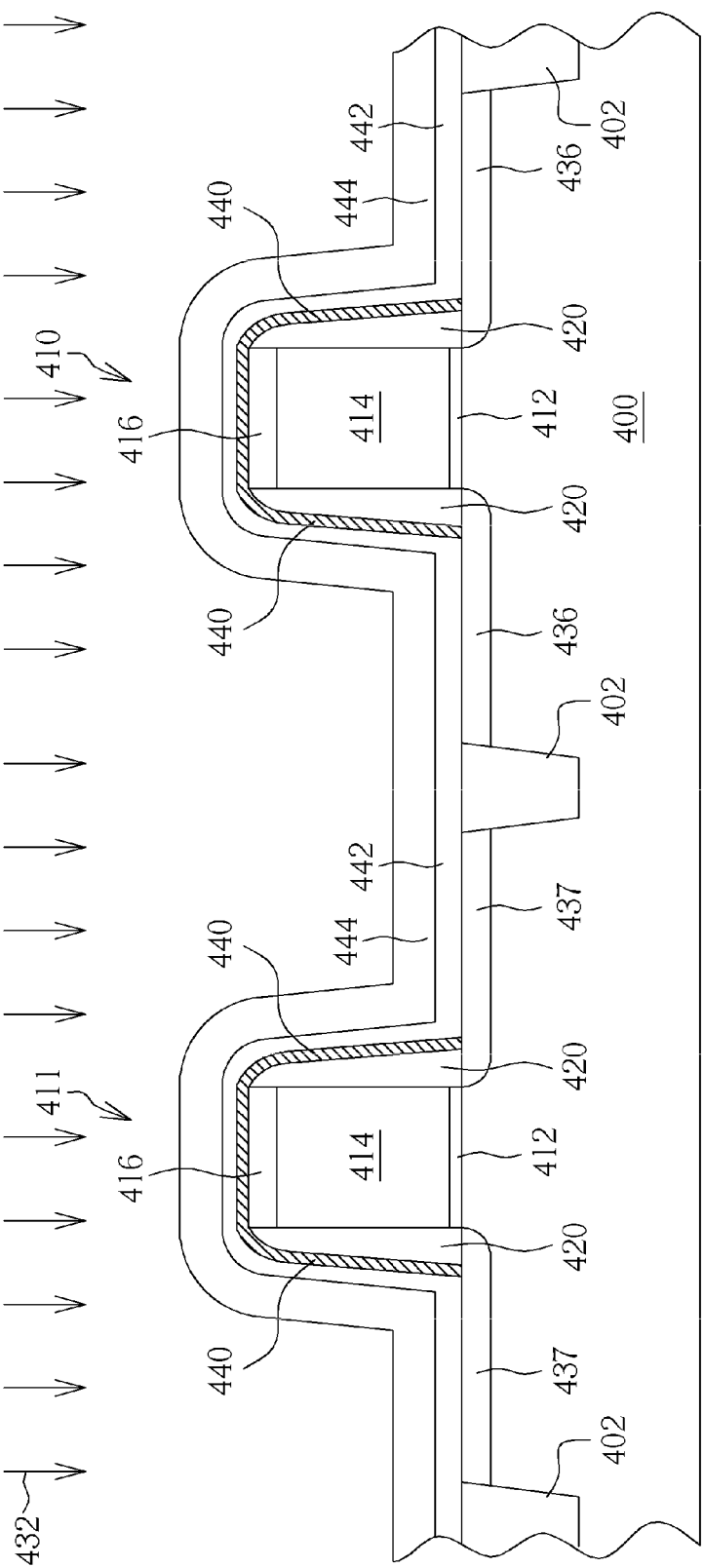

Please refer to FIG. 23. After forming the carbon-containing layer 442 and the silicon nitride layer 444, a thermal treatment 432 is subsequently performed to cause a thermal reaction between the carbon-containing layer 442 and the first spacer 420. In other words, the carbon-containing layer 442 reacts with the first spacer 420 and thus a protecting layer 440 is formed therebetween. The parameters of the thermal treatment 432 can be the same with those described in the aforementioned preferred embodiments, therefore those details are omitted for simplicity. It is noteworthy the protecting layer 440 is formed at the interface between the first spacer 420 and the carbon-containing layer 442, and includes SiCN-based material such as SiCN or SiOCN in accordance with the preferred embodiment. More important, the thermal treatment 432 drives-in the dopants 434 in the substrate 400 to form first LDDs 436 simultaneously with forming the protecting layer 440.

Figure 24:
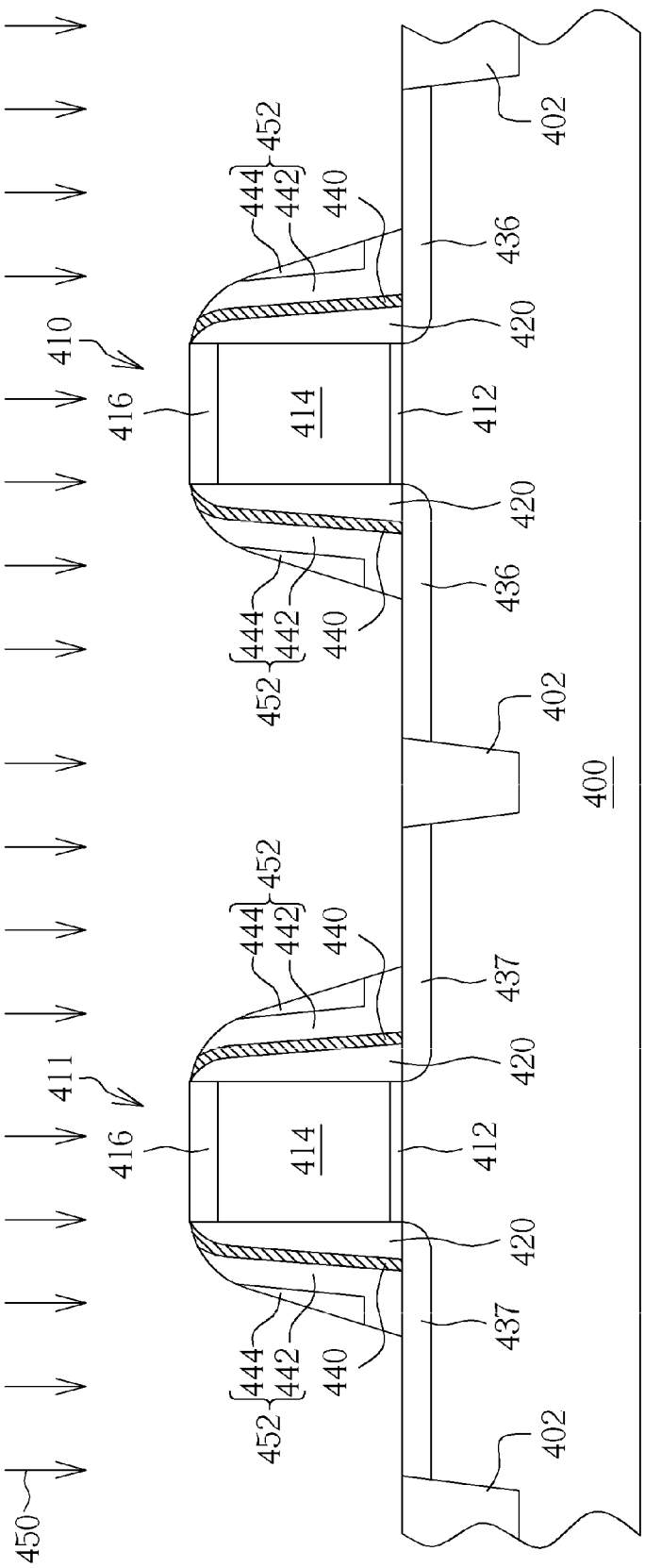

Please refer to FIG. 24. After forming the protecting layer 440 and the first LDDs 436, an etching back process 450 is performed to form a disposal spacer 452 respectively on the sidewalls of the first gate structure 410 and the second gate structure 411, particularly on the first spacer 420. The disposal spacer 452 including the carbon-containing layer 442 and the silicon nitride layer 444 further defines positions of recesses required by the SEG process at the two sides of the first gate structure 410.

After forming the disposal spacers 452, steps for forming recesses, performing SEG process, and forming source/drain as mentioned above can be performed. Since those steps are detailed in the aforementioned preferred embodiments, those details are omitted for simplicity.

According to the manufacturing method for the semiconductor device provided by the fifth preferred embodiment, the SiCN-based protecting layer 440 is formed before the SEG-related processes, particularly before the etching back process 450 that is used to form the disposal spacers 452. Simultaneously with forming the first LDDs 436 by the thermal treatment 432, the carbon-containing layer 442 of the disposal spacer 452 and the first spacer 420 react to form the SiCN-based protecting layer 440. Since etching rate of the SiCN-based the protecting layer 440 is different form that of the disposal spacer 452 and of the first spacer 420, the SiCN-based protecting layer 440 protects the first spacer 420, therefore the width and the profile of the first spacer 420 are unimpaired and impervious during removing the disposal spacers 452. Additionally, the profiles of the first gate structure 410 and the second gate structure 411 remain un-damaged. Therefore the distances between the source/drain, the gate structure, and its channel region all meet the expectation. Hence, yield of the manufacturing method and reliability of the obtained semiconductor device are ensured without increasing process complexity.

Figure 25:
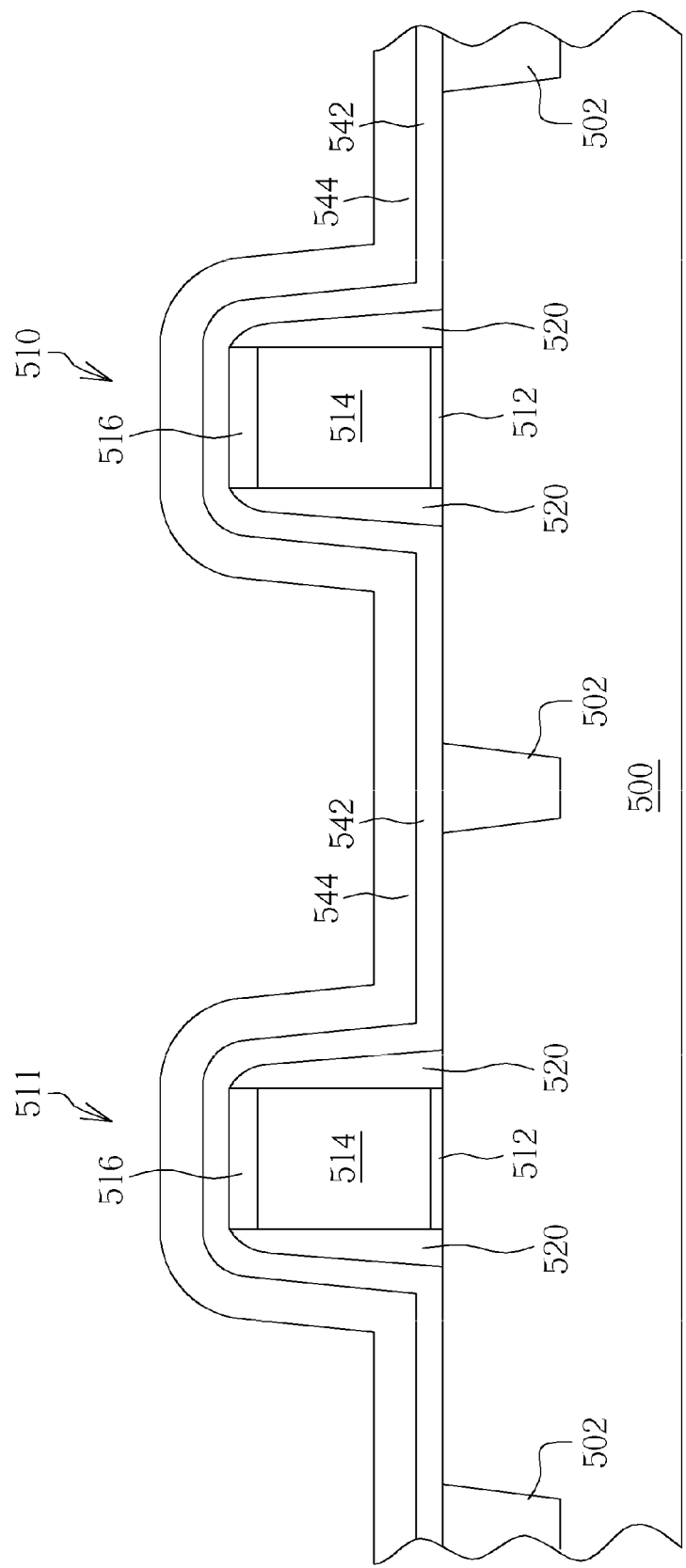

Please refer to FIGS. 25-28, which are drawings illustrating a manufacturing method for a semiconductor device provided by a sixth preferred embodiment of the present invention. It is noteworthy that elements the same in the first to fifth preferred embodiments can include the same materials. Those details are therefore omitted for simplicity. As shown in FIG. 25, the preferred embodiment first provides a substrate 500 having a plurality of STIs 502 for providing electrical isolation formed therein. A first gate structure 510 and a second gate structure 511 are formed on the substrate 500, and the first gate structure 510 and the second gate structure 511 include a gate dielectric layer 512, a gate conductive layer 514, and a cap layer 516 sequentially and upwardly stacked on the substrate 500. Furthermore, a first spacer 520 is formed on sidewalls of the first gate structure 510 and the second gate structure 511, respectively.

Please still refer to FIG. 25. Next, a carbon-containing layer 542 and a silicon nitride layer 544 are blanketly and sequentially formed on the substrate 500. As shown in FIG. 25, the carbon-containing layer 542 contacts the first spacer 520. In the preferred embodiment, the carbon-containing layer 542 can be a layer formed by CHCD and the silicon nitride layer 544 can be a silicon nitride layer formed by HCD. Additionally, a thickness of the carbon-containing layer 542 is about 40 Å, and a thickness of the silicon nitride layer 544 is about 130 Å. However, the thickness of the carbon-containing layer 542 and of the silicon nitride layer 544 can be modified depending on different process requirements.

Figure 26:
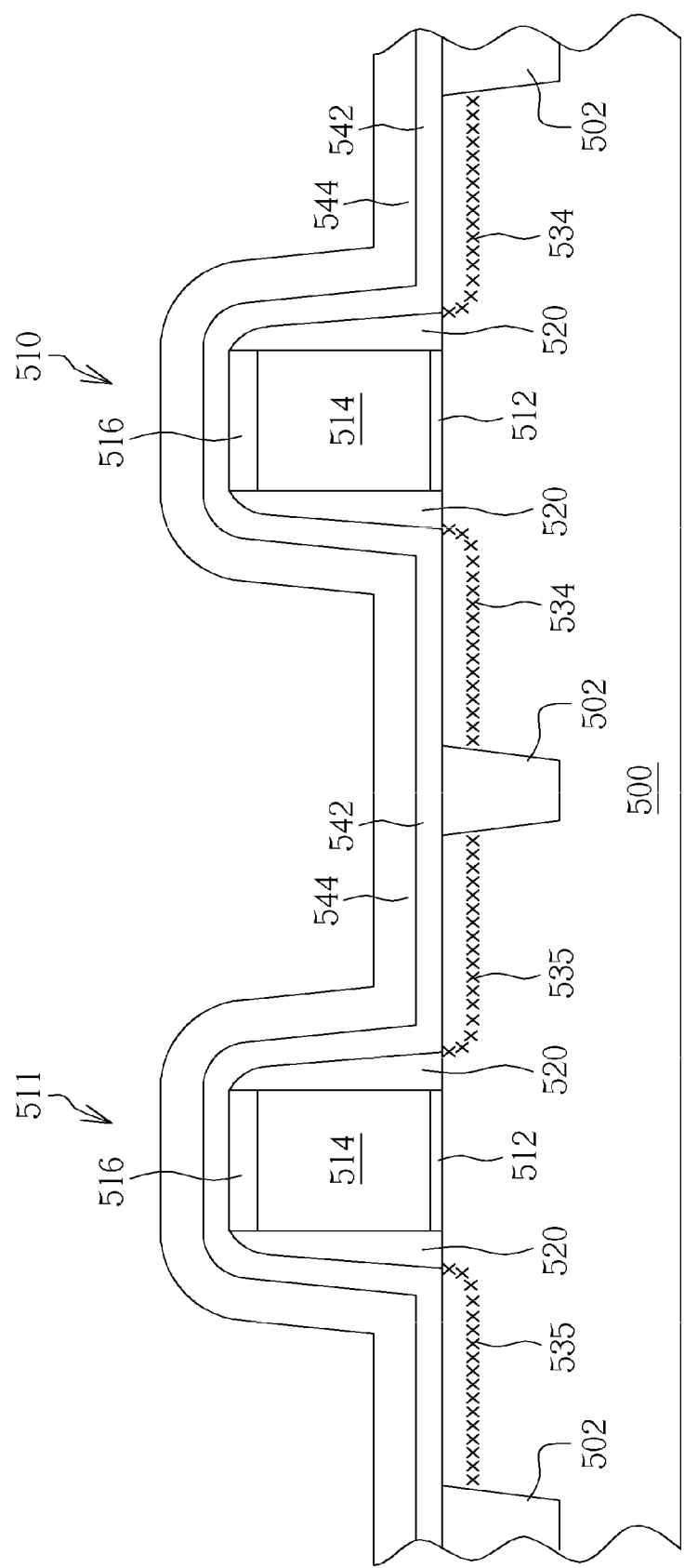

Please refer to FIG. 26. After forming the carbon-containing layer 542 and the silicon nitride layer 544, different ion implantations are performed to implant first dopants 534 into the substrate 500 respectively at two sides of the first gate structure 510, and to implant second dopants 535 into the substrate 500 respectively at two sides of the second gate structure 511. The first dopants 534 and the second dopants 535 are complementary to each other. It is noteworthy that according to the preferred embodiment, the carbon-containing layer 542 and the silicon nitride layer 544 serve as a multiple seal layer, thus the first dopants 534 and the second dopants 535 must penetrate through the multiple seal layer to get into the substrate 500.

Figure 27:
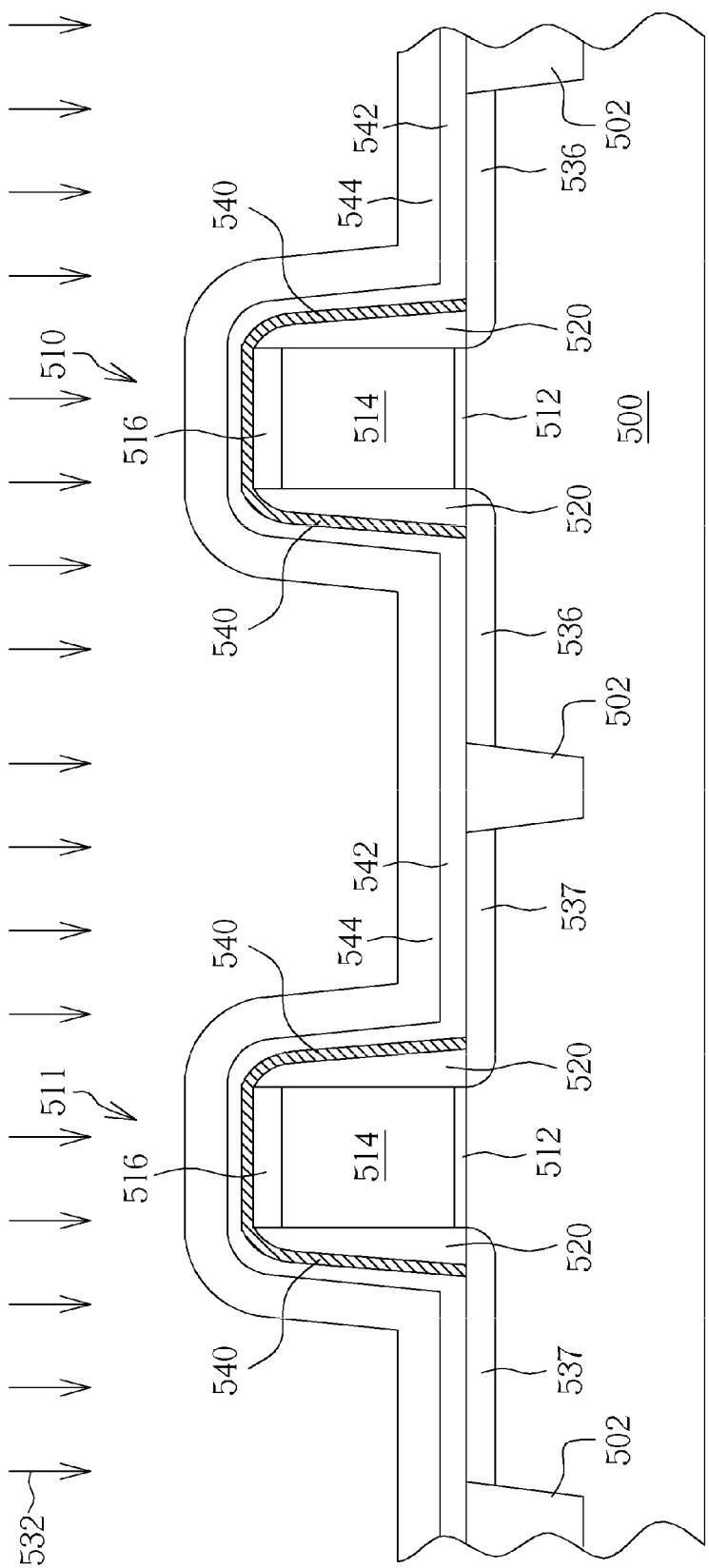

Please refer to FIG. 27. After performing the above mentioned ion implantations, a thermal treatment 532 is subsequently performed to cause a thermal reaction between the carbon-containing layer 542 and the first spacer 520. In other words, the carbon-containing layer 542 reacts with the first spacer 520 and thus a protecting layer 540 is formed therebetween. The parameters of the thermal treatment 532 can be the same with those described in the aforementioned preferred embodiments, therefore those details are omitted for simplicity. It is noteworthy the protecting layer 540 is formed at the interface between the first spacer 520 and the carbon-containing layer 542, and includes SiCN-based material such as SiCN or SiOCN in accordance with the preferred embodiment. More important, the thermal treatment 532 further drives-in the first dopants 534 and the second dopants 535 in the substrate 400 to form first LDDs 536 and second LDDs 537 simultaneously with forming the protecting layer 540.

Figure 28:
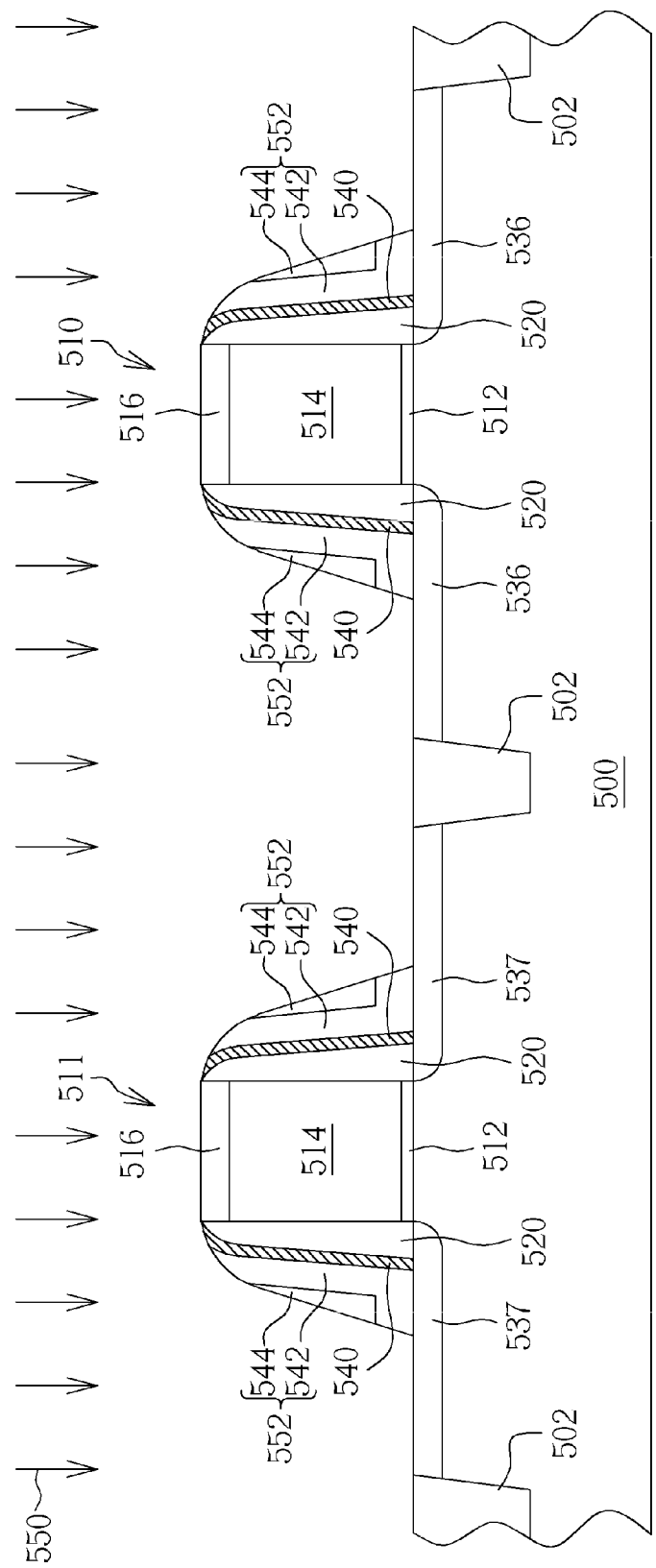

Please refer to FIG. 28. Next, an etching back process 550 is performed to form a disposal spacer 552 respectively on the sidewalls of the first gate structure 510 and the second gate structure 511, particularly on the first spacer 520. The disposal spacer 552 including the carbon-containing layer 542 and the silicon nitride layer 544 further defines positions of recesses required by the SEG process at the two sides of the first gate structure 510.

After forming the disposal spacers 552, steps for forming recesses, performing SEG process, and forming source/drain as mentioned above can be performed. Since those steps are detailed in the aforementioned preferred embodiments, those details are omitted for simplicity.

According to the manufacturing method for the semiconductor device provided by the sixth preferred embodiment, the carbon-containing layer 542 and the silicon nitride layer 544 are formed before the SEG-related processes, even before the ion implantations that is used to implant the dopants 534, 535 for forming the LDDs 536, 537. Simultaneously with forming the first LDDs 536 and the second LDDs 537 by the thermal treatment 532, the carbon-containing layer 542 of the disposal spacer 552 and the first spacer 520 react to form the SiCN-based protecting layer 540. Since etching rate of the SiCN-based the protecting layer 540 is different form that of the disposal spacer 552 and of the first spacer 520, the SiCN-based protecting layer 540 protects the first spacer 520, therefore the width and the profile of the first spacer 520 are unimpaired and impervious during removing the disposal spacers 552. Additionally, the profiles of the first gate structure 510 and the second gate structure 511 remain un-damaged. Therefore the distances between the source/drain, the gate structure, and its channel region all meet the expectation. Hence, yield of the manufacturing method and reliability of the obtained semiconductor device are ensured without increasing process complexity. Furthermore, since the carbon-containing layer 542 and the silicon nitride layer 544 serve as the seal layer, dopants 534, 535 have to penetrate the seal layer to get into the substrate 500. Consequently the following formed first LDDs 536 and the second LDDs 537 obtain the expected ultra shallow junction profile. Accordingly, SCE is efficiently suppressed and performance of the semiconductor device is improved by improving the ultra shallow junction profile of the LDDs even when the device size keeps shrinking.

According to the manufacturing method for the semiconductor device provided by the present invention, the thermal treatment is introduced to cause a reaction between the carbon-containing layer of the disposal spacer and the first spacer, so that a SiCN-based protecting layer is formed between the carbon-containing layer and the first spacer before forming the disposal spacer, before forming the recess required by the SEG process, after forming the recess, or after forming the epitaxial layer by the SEG process. Consequently, the SiCN-based protecting layer serves as an etching stop layer during removing the disposal spacer, and thus the underneath first spacer is protected from consumption. Since the first spacer remains unimpaired and impervious to the disposal spacer removal and possesses its original profile due to the protection rendered from the SiCN-based protecting layer, the subsequent steps for forming elements such as the second spacer and the source/drain are performed successfully and the obtained second spacer and source/drain all meet the expectation. Furthermore, since the thermal treatment simultaneously drives-in the dopants to form the LDDs in the substrate, it is conceivable that the manufacturing method for the semiconductor device provided by the present invention can be integrated and practiced in the industries, and to ensure yield of the manufacturing method and reliability of the obtained semiconductor device without increasing process complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a semiconductor device, comprising steps of:
    providing a substrate having at least a gate structure formed thereon, and a first spacer being formed on sidewalls of the gate structure;
    performing an ion implantation to implant dopants into the substrate;
    forming a disposal spacer on the sidewalls of the gate structure, the disposal spacer comprising at least a carbon-containing layer, and the carbon-containing layer directly contacting the first spacer; and
    after forming the disposal spacer, then performing a thermal treatment to form a protecting layer between the carbon-containing layer and the first spacer.

2. The manufacturing method for the semiconductor device according to claim 1, wherein the carbon-containing layer is formed by a carbon source and hexachlorodisilane ($Si_2Cl_6$, HCD).

3. The manufacturing method for the semiconductor device according to claim 1, wherein the protecting layer comprises silicon carbon nitride based (SiCN-based) material.

4. The manufacturing method for the semiconductor device according to claim 3, wherein the SiCN-based material further comprises silicon oxycarbonitride (SiOCN).

5. The manufacturing method for the semiconductor device according to claim 1, wherein the step of forming the disposal spacer further comprises:
    sequentially forming the carbon-containing layer and a silicon nitride layer blanketly covering the substrate; and
    etching back the silicon nitride layer and the carbon-containing layer to form the disposal spacer.

6. The manufacturing method for the semiconductor device according to claim 5, wherein the silicon nitride layer is formed by hexachlorodisilane ($Si_2Cl_6$, HCD).

7. The manufacturing method for the semiconductor device according to claim 1, wherein the thermal treatment further drives-in the dopants in the substrate to form lightly-doped drains (LDDs) in the substrate simultaneously with forming the protecting layer.

8. The manufacturing method for the semiconductor device according to claim 1, further comprising:
    performing an etching process to form a recess in the substrate respectively at two sides of the disposal spacer; and
    performing a selective epitaxial growth (SEG) process to form an epitaxial layer in each recess.

9. The manufacturing method for the semiconductor device according to claim 8, wherein the thermal treatment is performed before the etching process.

10. The manufacturing method for the semiconductor device according to claim 8, wherein the thermal treatment is performed after the etching process and before the SEG process.

11. The manufacturing method for the semiconductor device according to claim 8, wherein the thermal treatment is performed after the SEG process.

12. The manufacturing method for the semiconductor device according to claim 8, further comprising removing the disposal spacer to expose the protecting layer after forming the epitaxial layers.

13. The manufacturing method for the semiconductor device according to claim 12, further comprising steps of:
    forming a second spacer on the protecting layer; and
    forming a source/drain respectively in the epitaxial layers at two sides of the second spacer.

14. The manufacturing method for the semiconductor device according to claim 1, wherein the thermal treatment comprises a spike rapid thermal process (spike RTP).

15. The manufacturing method for the semiconductor device according to claim 1, wherein the thermal treatment comprises a process temperature between 850° C. and 1000° C.

16. A manufacturing method for a semiconductor device, comprising steps of:
- providing a substrate having at least a gate structure formed thereon, and a first spacer being formed on sidewalls of the gate structure;
- forming at least a carbon-containing layer on the substrate, and the carbon-containing layer directly contacting the first spacer;
- performing a thermal treatment to form a protecting layer between the carbon-containing layer and the first spacer; and
- performing an etching back process to form a disposal spacer on the sidewalls of the gate structure.

17. The manufacturing method for the semiconductor device according to claim 16, wherein the carbon-containing layer is formed by a carbon source gas and hexachlorodisilane ($Si_2Cl_6$, HCD).

18. The manufacturing method for the semiconductor device according to claim 16, wherein the protecting layer comprises silicon carbon nitride based (SiCN-based) material.

19. The manufacturing method for the semiconductor device according to claim 18, wherein the SiCN-based material further comprises silicon oxycarbonitride (SiOCN).

20. The manufacturing method for the semiconductor device according to claim 16, further comprising forming a silicon nitride layer on the carbon-containing layer, and the silicon nitride layer is formed by hexachlorodisilane ($Si_2Cl_6$, HCD).

21. The manufacturing method for the semiconductor device according to claim 16, further comprising performing an ion implantation to implant dopants into the substrate.

22. The manufacturing method for the semiconductor device according to claim 21, wherein the thermal treatment further drives-in the dopants in the substrate to form lightly-doped drains in the substrate simultaneously with forming the protecting layer.

23. The manufacturing method for the semiconductor device according to claim 21, wherein the thermal treatment is performed after the ion implantation.

24. The manufacturing method for the semiconductor device according to claim 21, wherein the carbon-containing layer is formed after performing the ion implantation.

25. The manufacturing method for the semiconductor device according to claim 21, wherein the carbon-containing layer is formed before performing the ion implantation.

* * * * *